United States Patent
Wu et al.

(10) Patent No.: US 8,625,337 B2
(45) Date of Patent: Jan. 7, 2014

(54) METHOD AND APPARATUS OF PROBABILISTIC PROGRAMMING MULTI-LEVEL MEMORY IN CLUSTER STATES OF BI-STABLE ELEMENTS

(75) Inventors: Wenqing Wu, San Diego, CA (US); Kendrick H. Yuen, San Diego, CA (US); Xiaochun Zhu, San Diego, CA (US); Seung H. Kang, San Diego, CA (US); Matthew Michael Nowak, San Diego, CA (US); Jeffrey A. Levin, Carlsbad, CA (US); Robert Gilmore, San Diego, CA (US); Nicholas Yu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 166 days.

(21) Appl. No.: 13/101,553

(22) Filed: May 5, 2011

(65) Prior Publication Data
US 2011/0273926 A1     Nov. 10, 2011

Related U.S. Application Data

(60) Provisional application No. 61/331,929, filed on May 6, 2010.

(51) Int. Cl.
*G11C 11/00*     (2006.01)

(52) U.S. Cl.
USPC .............................. 365/158; 365/148; 365/171

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/295, 421, 422, 427, E21.665, 257/E27.006; 438/3; 428/810–816, 428/817–825.1, 826; 977/933–935
See application file for complete search history.

(56) References Cited

U.S. PATENT DOCUMENTS

| | | | |
|---|---|---|---|
| 7,166,881 B2 | 1/2007 | Lin et al. | |
| 7,505,308 B1 | 3/2009 | Assefa et al. | |
| 7,506,236 B2 * | 3/2009 | Gallagher et al. | ............ 714/763 |
| 7,630,231 B2 | 12/2009 | Miltat et al. | |
| 7,893,511 B2 | 2/2011 | Ruehrig et al. | |
| 2005/0268207 A1 * | 12/2005 | Gallagher et al. | ............ 714/763 |

(Continued)

FOREIGN PATENT DOCUMENTS

| | | |
|---|---|---|
| JP | 2003188439 A | 7/2003 |
| JP | 2006196613 A | 7/2006 |
| WO | WO2010019881 | 2/2010 |

OTHER PUBLICATIONS

International Search Report and Written Opinion—PCT/US2011/035568-ISA EPO—Aug. 3, 2011.

*Primary Examiner* — Harry W Byrne
(74) *Attorney, Agent, or Firm* — Sam Talpalatsky; Nicholas J. Pauley; Joseph Agusta

(57) ABSTRACT

A probabilistic programming current is injected into a cluster of bi-stable probabilistic switching elements, the probabilistic programming current having parameters set to result in a less than unity probability of any given bi-stable switching element switching, and a resistance of the cluster of bi-stable switching elements is detected. The probabilistic programming current is injected and the resistance of the cluster state detected until a termination condition is met. Optionally the termination condition is detecting the resistance of the cluster of bi-stable switching elements at a value representing a multi-bit data.

6 Claims, 15 Drawing Sheets

(56) References Cited

U.S. PATENT DOCUMENTS

| | | |
|---|---|---|
| 2007/0258281 A1 | 11/2007 | Ito et al. |
| 2007/0297223 A1 | 12/2007 | Chen et al. |
| 2008/0238475 A1 | 10/2008 | Chua-Eoan et al. |
| 2009/0027810 A1 | 1/2009 | Horng et al. |
| 2009/0303779 A1 | 12/2009 | Chen et al. |
| 2009/0323404 A1 | 12/2009 | Jung et al. |
| 2011/0127626 A1 | 6/2011 | Li et al. |
| 2011/0147816 A1 | 6/2011 | Nikonov et al. |
| 2012/0241884 A1* | 9/2012 | Aikawa et al. ............... 257/421 |
| 2012/0303867 A1* | 11/2012 | Hall .............................. 711/103 |
| 2012/0303884 A1* | 11/2012 | Hall .............................. 711/105 |
| 2012/0303928 A1* | 11/2012 | Hall .............................. 711/172 |
| 2013/0187247 A1 | 7/2013 | Wu et al. |

* cited by examiner

METHOD AND APPARATUS OF PROBABILISTIC PROGRAMMING MULTI-LEVEL MEMORY IN CLUSTER STATES OF BI-STABLE ELEMENTS

CLAIM OF PRIORITY UNDER 35 U.S.C. §119

The present application for patent claims priority to Provisional Application No. 61/331,929, entitled "Method and Apparatus of Using STT-MTJ Array with Probabilistic Programming to Implement Non-Volatile Multi-Level Memory Cell (MLC)", filed May 6, 2010, and assigned to the assignee hereof and hereby expressly incorporated by reference herein.

FIELD OF DISCLOSURE

The technical field of the disclosure relates to bi-stable resistive element non-volatile memory and, more specifically, to spin torque transfer (STT) magnetic tunnel junction (MTJ) memory cells.

BACKGROUND

STT-MTJ is viewed as a promising technology for next generation non-volatile memory, as its known potential features include fast switching, high switching cycle endurance, low power consumption, and extended unpowered archival storage.

In operation an STT-MTJ element is switchable between two mutually opposite, stable magnetization states—"parallel" (P) and "anti-parallel" (AP), by passing an electric "write" current through its layers. Provided the write current is above a given critical point (CPT) the STT-MTJ will switch into the P or AP induced by the direction of the write current. A conventional STT-MTJ memory cell stores one bit, with one of the P and AP states assigned to represent a first binary value, e.g., a "0", and the other assigned to represent a second binary value, e.g., a "1." The stored binary value can be read because STT-MTJ elements have a lower relative electrical resistance in the P state than the AP state.

Conventional STT-MTJ memory employs write circuitry designed and constructed to inject a write current having a magnitude high enough and duration long enough to ensure it switches the STT-MTJ element to the correct P/AP state—with a probability target of unity. Conventional design philosophy for STT-MTJ memory is therefore a "deterministic" writing confined to the design paradigm of conventional memories, such as SRAM, where the switching of memory elements is deterministic.

Conventional design philosophy of deterministic STT-MTJ writing, however, necessarily includes design rules that obviate, to the fullest extent possible, the fact that STT-MTJ elements do not have a precise, repeatable, threshold at which AP→P or P→AP switching occurs.

This reason is illustrated in the FIG. 1 simulation graph 100. The included simulation graph 102A shows an example probability of STT-MTJ element switching P/AP states as a function of pulse width t, using a write pulse 104 current level above CPT. FIG. 1 simulation graph 102B shows, in contrast, probability of an STT-MTJ element switching P/AP states as a function of pulse width t, but using a write pulse 106 current level that is lower than CPT. As illustrated, although still conditional on the pulse width, at the increased write current level the probability of switching increases much more sharply than that seen with the lower pulse current level.

Therefore, obtaining acceptable write performance with conventional deterministic programming, meaning a write error rate below a given maximum bit error rate (BER) without an excessive pulse width, generally necessitates a write current level substantially above CPT. This is further illustrated at the FIG. 2 graph 200 of pulse width 202 versus probability of switching 204, where simulation switching probability curve 206 corresponds to a write current above the critical level. Point 2050 shows an example pulse duration of required for near unity probability of switching. These pulse current levels and durations that are necessary in conventional deterministic programming consume extra power and take extra time in the effort to approach deterministic switching. Referring to FIG. 2, to give perspective the probability curve 220 corresponds to a current, well below CPT, on which point 2052 shows an example read point.

In addition, conventional STT-MTJ memory requires read/write access and control circuitry for each STT-MTJ resistive element. Conventional STT-MTJ memory therefore requires a complete STT-MTJ memory cell for each bit of storage. Further, in each of the memory cells the STT-MTJ element footprint generally occupies a minor portion of the cell area. Increasing the size of an n row by m column (hereinafter "n×m") STT-MTJ array to larger values of m and n does nothing to remove this inefficiency.

SUMMARY

One embodiment provides a magnetic random access memory (MRAM) multi-level cell having at least one transistor for access control, and a cluster of N probabilistic bi-stable switching elements. The cluster may have a first cluster programming current terminal and a second cluster programming current terminal. In one aspect the probabilistic bi-stable switching elements are coupled in a cluster topology wherein, in response to receiving a programming current passing from one of the first and the second cluster programming current terminals, the cluster has a non-zero probability of switching into at least N+1 possible levels of resistivity.

In one aspect, the probabilistic bi-stable switching elements may include STT-MTJ elements. In one further aspect, a probabilistic current source is configured to generate the programming current with a characteristic to operate the STT-MTJ elements in a switching region not including any of a deterministic switching region nor a near-deterministic switching region.

One embodiment provides a method for programming a resistance through a cluster of bi-stable switching elements, and in one aspect the method may include detecting a state of the resistance, determining at least one programming current attribute based on the detected state, applying the programming current with said at least one determined attribute, and iterating through the detecting, determining and applying, until a given programming completion state is reached.

In one aspect, a method of programming according to one embodiment may include a programming pulse count, i.e., a counting of the number of iterations, and one programming completion state may be when the programming pulse count meets a given timeout, i.e., upon the number of iterations reaching a timeout equal to a given number of iterations, and another programming completion state may be detecting a state of the resistance meeting a given resistance criterion.

In one further aspect, a method according to one embodiment may include determining the timeout based on a given bit error rate and a switching characteristic of the bi-stable switching elements that, within the number of iterations represented by the timeout, a probability of the difference between the resistance state and the target resistance of the cluster of bi-stable switching elements provides a bit error rate no larger than the given bit error rate. In one aspect, programming current attributes may include a current direction, which may be a given forward direction, a given reverse direction, and/or a forward direction or reverse that may be determined by, for example, a difference between the detected resistance state and the target resistance state.

In one further aspect, a method according to one embodiment may further include determining the timeout based on a given programming delay limit and attributes of the determined programming current that, within the number of iterations represented by the timeout, will result in the programming delay being no larger than the given programming delay limit.

In one aspect, in a method according to one embodiment programming current attributes may include a unidirectional current having a magnitude optimized to reach the target resistance state. In one further aspect, the current magnitude may be optimized by optimizing average required programming iterations to reach given target resistance states. In one aspect, current magnitude may be optimized with respect to an average required programming power to reach given target resistance states. In one aspect, current magnitude may be optimized with respect to an average required programming delay to reach given target resistance states.

One embodiment provides a probabilistic resistive memory including a resistive element cluster having, for example, N bi-stable elements, each bi-stable element configured to switch in response to a programming current, between a first resistance state of at least two resistance states and a second resistance state of the at least two resistance states, with a switching probability determined by a value of at least one parameter of the programming current, and may include a probabilistic programming controller to detect a cluster resistance state of the resistive element cluster and to inject a programming current through the resistive element cluster, with the value of the at least one parameter determining the switching probability to be less than one.

In one aspect of a probabilistic resistive memory according to one embodiment, the probabilistic programming controller may be configured to detect an occurrence of a given termination condition, and may be configured to repeat detecting the cluster resistance state and injecting the programming current through the resistive element cluster until detecting the given termination condition.

In one aspect, one given termination condition may be a given timeout value, and the time-out value may be based on a given bit error rate limit and on the switching probability determined by the at least one parameter of the programming current, such that when the timeout value is reached the programming bit error rate is no larger than the given bit error rate limit.

In one aspect, one termination condition may be a given timeout value, and the time-out value may be based on a given programming delay limit and on the switching probability determined by the at least one parameter of the programming current, such that when the timeout value is reached the programming delay is no larger than the given programming delay limit.

One embodiment provides a probabilistic resistive memory having a cluster of bi-stable switching elements, means for detecting a state of a resistance through the cluster of bi-stable switching elements, means for determining at least one programming current attribute based on the detected state, means for applying the programming current to the cluster of bi-stable switching elements according to the at least one determined attribute; and means for iterating the detecting, the determining and the applying until a given programming completion state is reached.

BRIEF DESCRIPTION OF THE DRAWINGS

The accompanying drawings found in the attachments are presented to aid in the description of embodiments of the invention and are provided solely for illustration of the embodiments and not limitation thereof.

DETAILED DESCRIPTION

Figure 1:
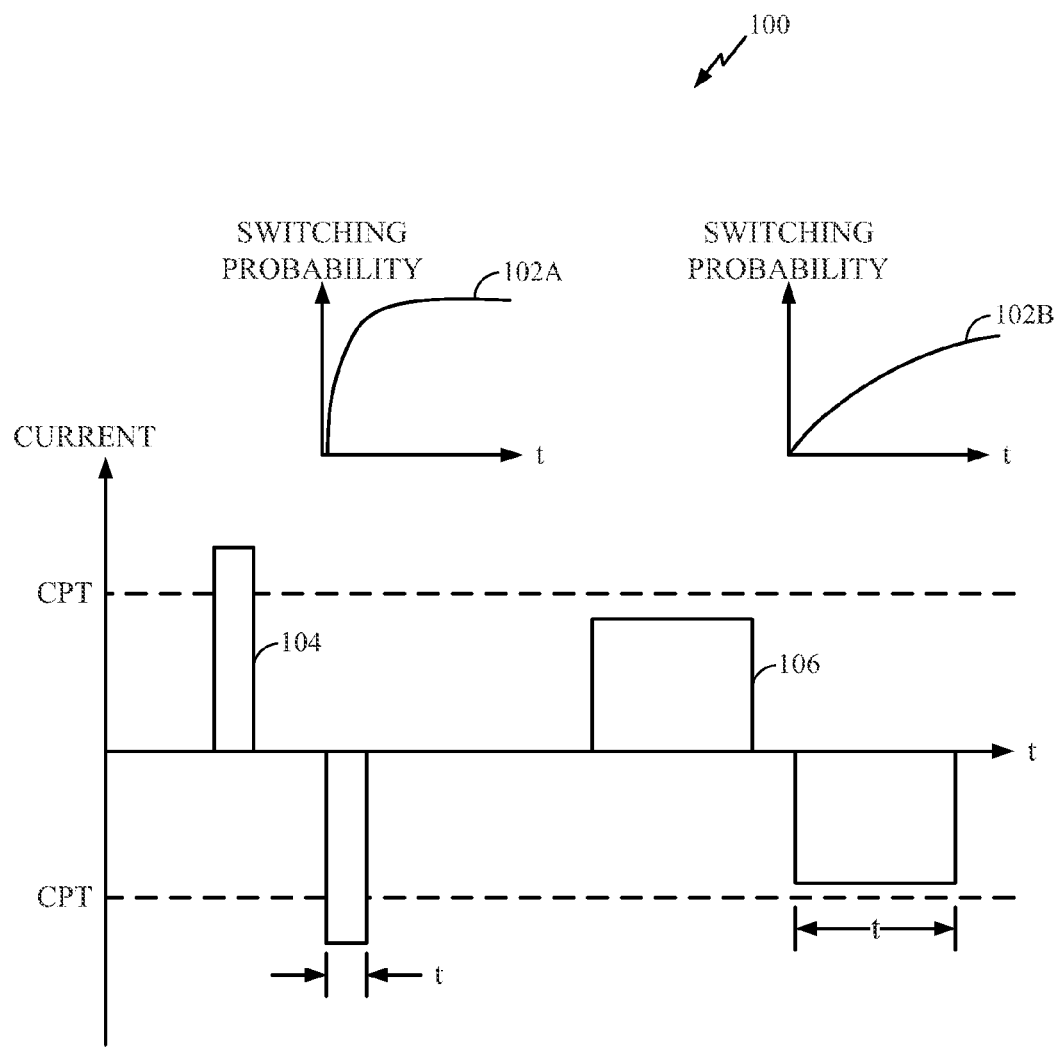
FIG. 1 shows probability characteristics of a write pulse producing a desired switch of an STT-MTJ with respect to pulse width.
Figure 2:
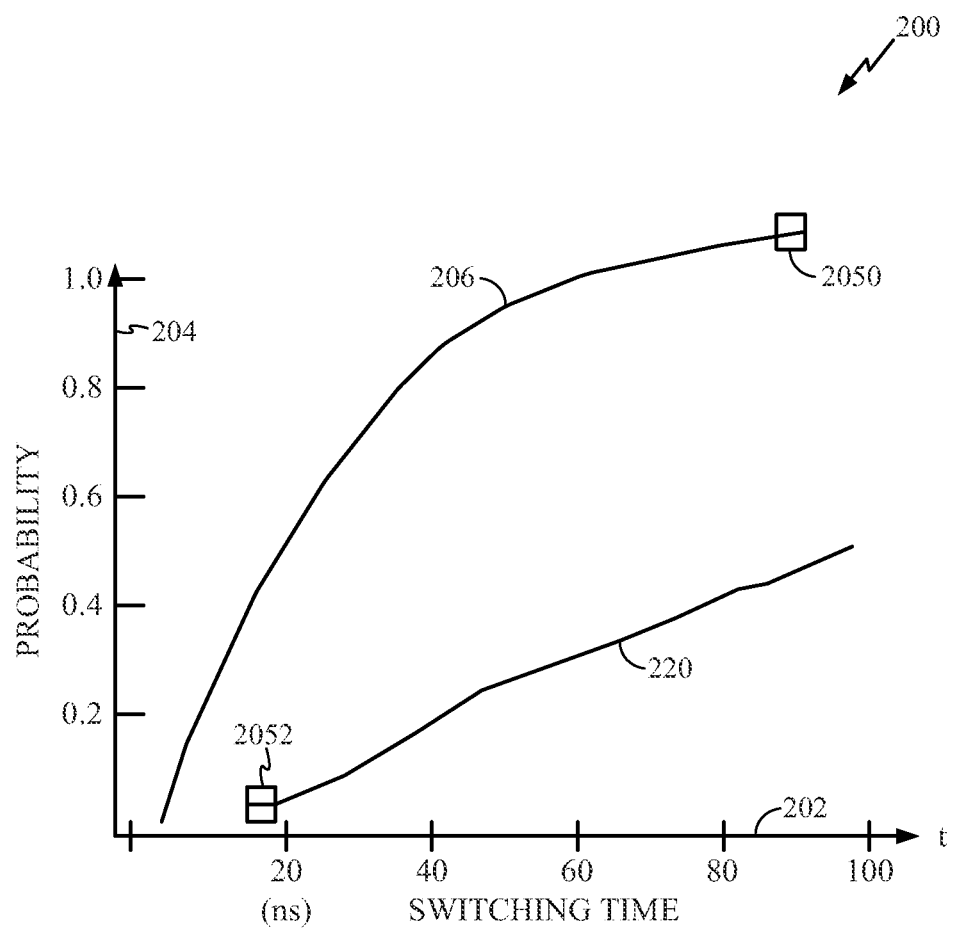
FIG. 2 shows one example of conventional STT-MTJ write pulse amplitude/duration parameters for obtaining acceptable bit error.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields, electron spins particles, electrospins, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for implementation. Accordingly, the invention is not limited to illustrated examples and any means for performing the functionality described herein are included in embodiments of the invention.

Various exemplary embodiments provide STT-MTJ cluster cells of N STT-MTJ elements, and provide probabilistic programming of each STT-MTJ cluster cell to have, in one aspect, any of at least N+1 cluster resistances, without requiring individual access to the STT-MTJ elements.

As used herein the term "cluster resistance" ($R_{CLST}$) means the resistance from the coupling of the cluster to one programming current line, into which a programming current may enter or exit the cluster, to a coupling of the cluster to another programming current line, from which the programming current may exit or enter the cluster.

In addition, as used herein the term "cluster state" means the ensemble P/AP state of the N element STT-MTJ cluster in terms of how the P/AP states are assumed by the individual STT-MTJ elements composing the cluster. This definition of "cluster state" may not identify the specific STT-MTJ elements within the N-element STT-MTJ cluster. This is acceptable because various exemplary embodiments of the invention provide cells with multi-bit storage and error correction storage, without requiring detection, or control of the P/AP states of the cell's individual STT-MTJ elements.

Persons of ordinary skill in the pertinent art will appreciate, upon reading this disclosure, that the exemplary embodiments provide registration of information in an STT-MTJ cluster in the form of cluster resistance level, and retrieval by detecting the resistance level of the cluster. Various examples of connection topology are described, and others will become apparent in practicing according to the embodiments. It will be understood that depending on the particular connection topology of the cluster's constituent N bi-stable STT-MTJs, and on the proportional relation between the resistance levels to which the different bi-stable STT-MTJs may switch, the resulting cluster may have anywhere from N+1 to $2^N$ different resistance levels. As one example, one cluster according to one exemplary embodiment may comprise three identical STT-MTJs connected in series and each of these STT-MTJs may switch to resistance level r or resistance level 2r. This example cluster can take any of the four different resistance levels: 3r, 4r, 5r and 6r, and can therefore provide a 2-bit information storage. In another example, one STT-MTJ cluster according to another exemplary embodiment may comprise three identical STT-MTJs with two of the three STT- MTJs connected in parallel and the third STT-MTJ connected in series with the parallel arrangement of the first two and, in a further and more specific example, each of these three STT-MTJs may switch between a resistance level r and a resistance level 2r. This example STT-MTJ cluster can take any of the following six different resistance levels: 9r/6, 10r/6, 12r/6, 15r/6, 16r/6, and 18r/6. This example can therefore provide more than two bits of information storage. In still another example, one STT-MTJ cluster according to one exemplary embodiment may comprise three differently structured STT-MTJs connected in series, the difference in structure being such that one of the three STT-MTJs is able to switch between resistance level r and resistance level 2r, a second of the three STT-MTJs is able to switch between resistance level 2r and resistance level 4r, and the third of the STT-MTJs is able to switch between resistance level 4r and resistance level 8r. This example STT-MTJ cluster according to one exemplary embodiment can take any of the following 8 different resistance levels: 7r, 8r, 9r, 10r, 11r, 12r, 13r and 14r. This example can therefore provide a 3-bit information storage.

Specific example STT-MTJ clusters and associated methods according to the exemplary embodiment are described having N indistinguishable, in terms of respective resistance levels, STT-MTJs connected in symmetric topologies. As will be understood by persons of ordinary skill in the pertinent art, from reading this disclosure, such example STT-MTJ clusters according to the exemplary embodiments, when implemented with this relative structure of constituent STT-MTJs, in a symmetric topology, can represent N+1 different resistance levels. These examples are therefore described as providing N+1 different resistance levels. It will be understood by such person that these described examples are not intended as limiting the embodiments to identical resistance level STT-MTJs, connected according to a symmetric topology. Instead these are used to introduce concepts in an implemented form having less complexity, both in the form itself and in its description, that is not fundamental to the concepts they are intended to illustrate. Persons of ordinary skill in the pertinent arts, however, upon reading this disclosure, can readily practice according to its described embodiments and various alternative forms of the same, using clusters of non-identical STT-MTJs and/or non-symmetric topology, by applying general know-how possessed by such persons to the described concepts.

As will be appreciated, in one embodiment all of the plurality of STT-MTJ elements forming a cluster may have the same (within acceptable design and fabrication tolerances) $R_P$ and $R_{AP}$ value and, further, may be arranged in various cluster topologies in which a change in P/AP state of one STT-MTJ element produces a corresponding change in cluster resistance regardless of which STT-MTJ element changes state. Therefore, in one aspect, although there are $2^N$ possible states of the N-element STT-MTJ cluster, each of these $2^N$ possible states may fall into one of only N+1 possible $R_{CLST}$ values. It will be understood, however, that the embodiments are not limited to equal $R_P$ and $R_{AP}$ value STT-MTJ elements. On the contrary, exemplary embodiments may be practiced employing different STT-MTJ elements within an N-element STT-MTJ cluster, having distinctly different $R_P$ and $R_{AP}$ values.

It will be understood that except where explicitly stated or made clear from the context, operations described in reference to switching from one of the P and AP states to the other would be identical, with respect to concept, if described in reference to the opposite switching.

In one general embodiment, an N-element STT-MTJ cluster cell may be configured to provide an N+1 level storage, programmable into any of the N+1 levels by probabilistic programming, as is described in greater detail at later sections. In one aspect the N+1 levels may provide storage of M bits of information, where M is $Log_2(N+1)$, without requiring control of the individual STT-MTJ element states. In another aspect, the N+1 levels may provide an error correcting cell (ECC) that will function as a one-bit binary storage provided regardless of having non-switching STT-MTJ elements. A further aspect according to one general embodiment assigns M, the number of bits stored by the N-element STT-MTJ cluster cell, to be less than $Log_2(N+1)$, obtaining both multi-bit storage and ECC storage, as described in greater detail at later sections.

In one general embodiment, probabilistic programming of an N-element STT-MTJ cluster begins by receiving a data to store and then determining (e.g., through a look-up table) the $R_{CLST}$ value that represents the data. That $R_{CLST}$ value may be termed "the target $R_{CLST}$ value." In one aspect the probabilistic programming reads the present state of the N-element STT-MTJ cluster and determines whether its present $R_{CLST}$ value is above or below the target $R_{CLST}$ value. If the present $R_{CLST}$ value is above the target $R_{CLST}$ then, since $R_{AP}$ is greater than $R_P$, an excess number of the STT-MTJ elements of the N-element STT-MTJ cluster are in the AP state (or, alternatively stated, too few are in the P state). The probabilistic programming in response injects into the N-element STT-MTJ cluster a programming current having particularly set parameters. The parameters (collectively referenced as "PM") are specifically set so that every STT-MTJ element present in the AP state will have a probability $P_{MTJ}$ (PM) of switching to the P state. In one aspect, when the programming current is injected into the N-element cluster every STT-MTJ element presently in the AP state will have the same (or have a suitably narrow statistical spread about the same) probability $P_{MTJ}$ (PM) of switching to the P state.

Example parameters PM may in one aspect characterize a pulse form or pulse attribute, for example a current pulse length, alternatively termed a current length or pulse width, and/or may characterize a pulse polarity. In a further aspect, example parameters PM may characterize a current analog ramp, or current digital ramp, defining for example an analog ramp attribute or digital ramp attribute such as a ramp slope, ramp magnitude and/or ramp polarity. It will be understood that these identified write current pulse and ramp forms, as well as the examples of corresponding parameters PM for setting and adjusting each, are only for purposes of illustration. Other programming current forms and other programming current parameters defining, for example, an analog waveform or digital waveform according to at least one analog waveform attribute, and/or at least one digital waveform attribute, are contemplated In a probabilistic programming according to the exemplary embodiments, a probable result of the above-described first iteration, i.e., first injection of programming current is that a quantity of the STT-MTJ elements will switch from the AP state to the P state. It will be understood that the actual quantity of the STT-MTJ elements that will switch is not known. Instead, only the probable quantity is known. To determine the actual quantity of the STT-MTJ elements that switched after each iteration the updated $R_{CLST}$ value is therefore read. If the updated $R_{CLST}$ value is still above the target $R_{CLST}$ value another programming current pulse may be injected, in the same direction as in the first injection. On the other hand, if the updated $R_{CLST}$ value is below the target $R_{CLST}$ value then another programming current pulse may be injected, but in the opposite direction as in the first injection.

In one aspect, one or more of the programming current parameters may be changed for second injection, to change the probability $P_{MTJ}$. For example, in this aspect, if the updated $R_{CLST}$ value is only one increment (meaning only one STT-MTJ element needs to change state) above the target $R_{CLST}$ value then the duration or amplitude of the second programming current pulse may be decreased. This may decrease the probability of the second pulse switching more than one of the STT-MTJ elements in the AP state to the P state, thereby necessitating an additional iteration. As readily understood, this additional iteration would be done with the programming current in the opposite direction.

In another aspect, the programming current parameters may be selected to have the same switching probability $P_{MTJ}$, at least within given design and fabrication tolerances, for the second programming pulse. In this aspect of not changing the programming current parameters after each iteration, the value $P_{MTJ}$ may preferably be optimized, a priori, to minimize the number of such iterations (hereinafter "the pulse count" (PC)). As will be understood from this disclosure, if the programming current parameters result in a $P_{MTJ}$ that is too high a result may be an undesirably high rate of "overshooting" the target $R_{CLST}$ value. For example, in instances where the updated $R_{CLST}$ value is within one or two increments of the target $R_{CLST}$ value a $P_{MTJ}$ that is too high may too often cause more than one or two of the STT-MTJ elements to switch. Another, correcting iteration would then be required, with an opposite direction programming current. There would also be a probability of the additional iteration again switching too many of the STT-MTJ elements. On the hand, if the programming current parameters result in a $P_{MTJ}$ that is too low a result may be an undesirably large PC needed for $R_{CLST}$ to converge to the target. Example processes and techniques for optimizing $P_{MTJ}$ to minimize PC are described in greater detail at later sections.

Figure 3:
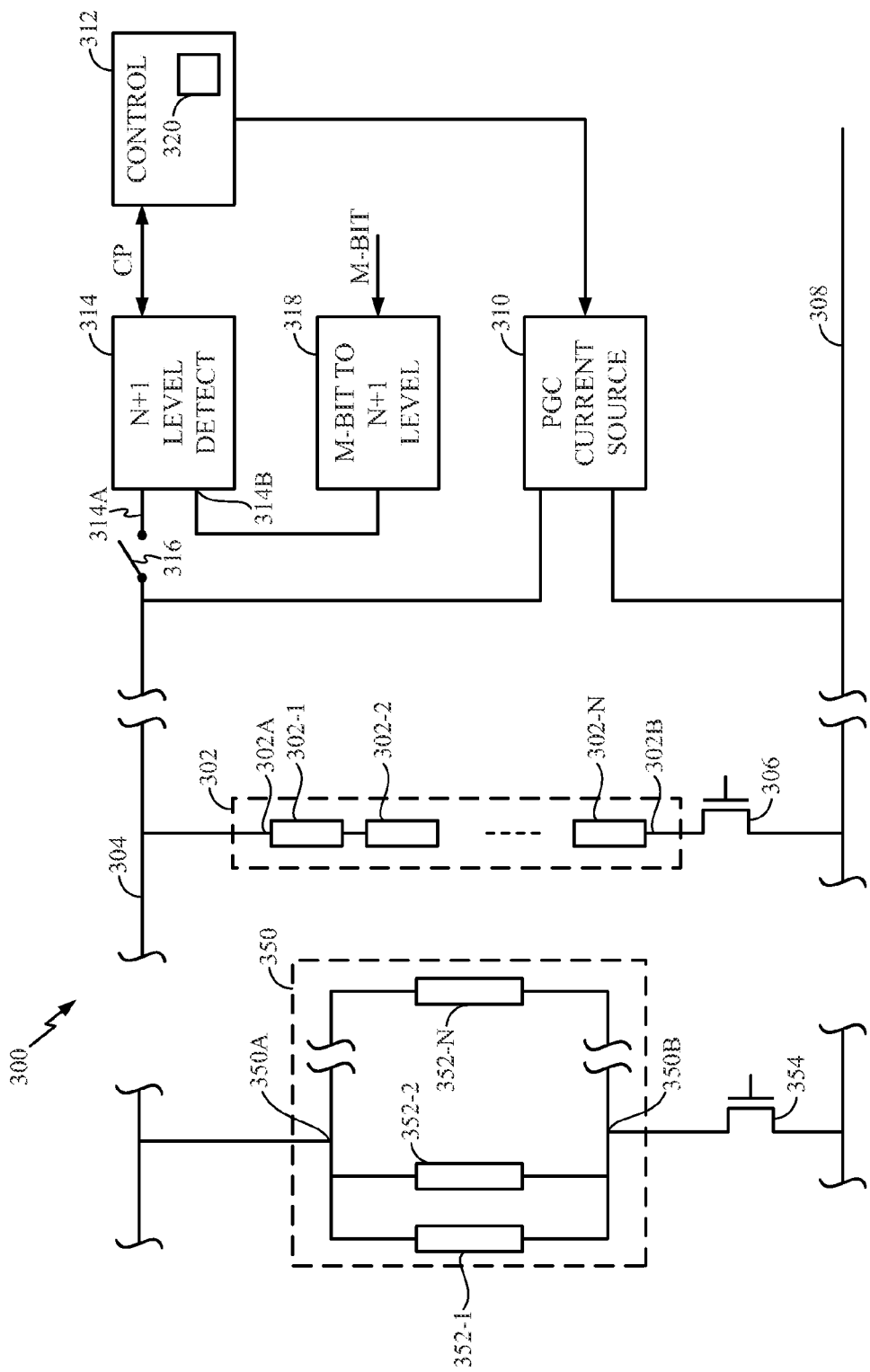
FIG. 3 shows one example probabilistic program multi-level STT-MTJ cluster memory according to one or more exemplary embodiments.

FIG. 3 shows one example of an N-element STT-MTJ cluster cell 300 according to one or more exemplary embodiments. In one aspect, the N-element STT-MTJ cluster cell 300 may include an N-element STT-MTJ serial cluster 302 comprising a series of N STT-MTJ elements 302-1, 302-2 . . . 302-N. In another aspect, described in greater detail at later sections, the N-element STT-MTJ cluster cell 300 may include an N-element STT-MTJ parallel cluster 350 comprising a parallel arrangement of N STT-MTJ elements 352-1, 352-2 . . . 352-N, forming a programmable resistance between points 350A and 350B. Referring now to the aspect employing the N-element STT-MTJ serial cluster 302, the N-element STT-MTJ serial cluster 302 is coupled at one end 302A to a read/write current (BL) line 304, and coupled at its other end 302B through an enabling switch 306 to another read/write current (SL) line 308. It will be understood that the BL 304 and SL 308 may extend and couple to each of a plurality of additional STT-MTJ clusters (not shown) that may be identical to the FIG. 3 example N-element STT-MTJ serial cluster 302. The BL line 304 and the SL line 308 may be in accordance with conventional n×m array STT-MTJ memory bit line and source line means. Likewise the enabling switch 306 may be in accordance with conventional n×m array STT-MTJ memory word enable switch means. It will also be understood that the BL line 304, the SL line 308, and the enabling switch may be other than convention bit lines, source lines and word transistors, respectively.

Continuing to refer to FIG. 3, a probabilistic programming current (PGC) source 310 controlled by a probabilistic programming (PPG) controller unit 312 as described in greater detail below, couples to the BL line 304 and to the SL line 308. An N+1 level voltage detector 314 may have a sense input 314A coupled to the BL line 304 though a read enabling switch 316, a sense input 314B coupled to an M-bit to N+1 level converter 318. The M-bit data to N+1 level converter 318 may convert the M-bit data into an N+1 level target resistance voltage signal $V_{CLS/TGT}$. The N+1 level converter 318 may provide a compare (CP) signal to the PPG controller 312.

It will be understood that the N+1 level voltage detector 314 may include a read current source (not explicitly shown) to inject a read current via the BL source line 304 through the N-element STT-MTJ serial cluster 302. Regarding particular structure of the N+1 level voltage detector 314, persons of ordinary skill in the art, applying general know-how of multilevel voltage detectors can, in view of this disclosure, readily select and implement various devices performing its described functions. Further detailed description is therefore omitted.

It will also be understood that the depicted blocks such as the probabilistic programming controller 312 are functional blocks, shown separate for purposes of describing example processes, and not necessarily representative of any arrangement or segmentation of hardware. For example, described functions of the PPG controller 312, for example the timeout counter 320 may be embedded in, and distributed among, various devices implementing other of the depicted functions, for example the PGC source 310 or the N+1 level voltage detector 314.

In one aspect, as will be described in greater detail at later sections, the PPG controller 312 may control the PGC source 310 to inject a probabilistic programming current $I_{P \to AP}$ or $I_{AP \to P}$ through the N-element STT-MTJ serial cluster 302 and, before proceeding further, the PPG controller 312 may receive a comparison signal CP from the N+1 voltage level detector 314. From the comparison signal CP the PPG controller 312 may identify if the cluster state of the N-element STT-MTJ serial cluster 302 is at, or above or below a target cluster state corresponding to the M-bit data input to the M-bit to N+1 level converter 318. The PPG controller 312 may determine the programming is complete if the CP signal indicates the N-element STT-MTJ serial cluster 302 is at the target cluster state.

In another aspect, the PPG controller 312 controls the PGC source 310 (as well as the enabling switch 306 and read enabling switch 316) to repeat, as iterations or loops, injecting a programming current $I_{P \to AP}$ or $I_{AP \to P}$ through the N-element STT-MTJ serial cluster 302, detecting a resulting or updated cluster state of the N-element STT-MTJ serial cluster 302 relative to the target cluster state caused, and repeating the loop until detecting a programming complete condition, alternatively referenced herein as a termination condition. One termination condition, as previously described, is the N-element STT-MTJ serial cluster 302 being at the target cluster state. In one aspect, PGC controller 312 may include a timeout counter 320 to count the iterations as a running pulse count (PC), and the termination condition being PC reaching a given timeout value. In one aspect, the timeout value may be a function of a desired maximum bit error rate (BER), and of the value of N and the $P_{MTJ}$ corresponding to the chosen parameter values PM. The function, as will be readily understood by persons of ordinary skill in the art from this disclosure, may be obtained through simulation or, for example, empirical means. In another aspect, the timeout value may be set to keep the PPG delay within a maximum programming delay.

In accordance with various exemplary embodiments, one or both of the PPG controller 312 and the PGC source 310 are configured to inject the probabilistic programming current $I_{P \to AP}$ or $I_{AP \to P}$ with current parameters PM (e.g., pulse amplitude, pulse length, or other waveform parameters) set to produce an optimized $P_{MTJ}$, $P_{MTJ,OPT}$. In one aspect, $P_{MTJ,OPT}$ is determined, through means and processes described in greater detail at later sections, that provide a minimum average PC for the N-element STT-MTJ serial cluster 302 to reach the target cluster state. As previously described, and as will be understood by persons or ordinary skill in the art from this disclosure, if the parameters of $I_{P \to AP}$ and $I_{AP \to P}$ establish a $P_{MTJ}$ that is too high then, although large cluster state changes (e.g., switching all of the STT-MTJ elements from one of the P and AP states to the other of the P and AP states) may be accomplished quickly, small cluster state changes may be difficult to realize. Alternative parameters of $I_{P \to AP}$ and $I_{AP \to P}$, and aspects of controlling these parameters, are described in greater detail at later sections.

Referring to FIG. 3, to focus description on the embodiments without importing unnecessary complexity not particular to the concepts, a default relation of $R_{AP}$ and $R_P$ will be $R_{AP}$ being double $R_P$, i.e., $R_{AP}=2R_P$. This example relation of $R_{AP}=2R_P$ is, as stated, only for focusing this description and does not limit the scope of any embodiments. On the contrary, upon reading this disclosure, persons of ordinary skill in the art may readily adapt the described concepts to practicing the exemplary embodiments using other proportional relationships between $R_{AP}$ and $R_P$.

One example device according to the FIG. 3 N-element STT-MTJ cluster cell 300 may use a 3-element STT-MTJ serial cluster implementation of the N-element STT-MTJ serial cluster 302 three to implement a 4-level, 2-bit memory cell. In such an example, assuming as stated above that $R_{AP}=2R_P$, the minimum $R_{CLST}$ will be $3R_P$ and will occur when all three STT-MTJ elements are in the P state (which will be termed the "S0 cluster state"), and the maximum $R_{CLST}$ will be $6R_P$, and will occur when all three STT-MTJ elements are in the AP state (which will be termed the "S3 cluster state"). As readily understood, the $R_{CLST}$ minimum corresponding to the S0 cluster state will be $3R_P$, and the $R_{CLST}$ represented by the S3 cluster state will be $6R_P$. The S0 cluster state may be assigned to represent binary "00," and the S3 cluster state may be assigned to represent binary "11." An "S1 cluster state" may be defined as any cluster state in which one of the three STT-MTJ elements is in the AP state, while the remaining two are in the P state. The S1 cluster state may be assigned to represent binary "01." The $R_{CLST}$ corresponding to the S1 cluster state (assuming as previously described that $R_{AP}=2R_P$) will therefore be $4R_P$. Lastly, an "S2 cluster state" may be defined as any cluster state in which two of the three STT-MTJ elements are in the AP state, while the remaining one is in the P state. The S2 cluster state may be assigned to represent binary "10." The $R_{CLST}$ corresponding to the S2 cluster state (again, as previously described, assuming that $R_{AP}=2R_P$) will be $5R_P$.

It will be understood that the association between cluster states (e.g., S0, S1 . . . ) and M-bit binary values is not limited to being direct as in the above described example. To illustrate, cluster state S0 may be assigned to represent binary "10," while cluster state S3 may be assigned to represent binary "00."

Example processes of probabilistic programming of N-bit STT-MTJ cluster cells according to the exemplary embodiments, including the above-described example 4-level, 2-bit memory cell, will be described in reference to FIG. 4 and elsewhere in this disclosure. As will be appreciated by persons of ordinary skill in the art from this disclosure, a 4-level, 2-bit memory cell provided by the above-described configuration of the FIG. 3 N-element STT-MTJ cluster cell 300 may be configured to provide for two bits of storage without requiring individual access to the 3 STT-MTJ elements forming the cluster.

Another example device according to the FIG. 3 N-element STT-MTJ cluster cell 300, which may use the same example STT-MTJ serial cluster 302 topology of, for example, three STT-MTJ elements, will implement a 4-level, 1-bit error correcting cell (ECC). In this 4-level STT-MTJ ECC cell example, the minimum $R_{CLST}$ of $3R_P$ will, as described above, occur when all three STT-MTJ elements are in the P state and, likewise, the maximum $R_{CLST}$ of $6R_P$ will occur when all three STT-MTJ elements are in the AP state. In this example 4-level, 1-bit STT-MTJ ECC cell, though, both the S0 cluster state and the S1 cluster state may be assigned to represent "0," and both the S2 and the S3 cluster states may be assigned to represent "1."

As can be readily appreciated, proper functioning of the 4-level, 1-bit ECC STT-MTJ cluster of the above-described example requires that just two of its three STT-MTJ elements switch correctly. Further, if all three of the STT-MTJ elements are switching correctly then storage of a "0" is completed the moment the N+1 level voltage detector 314 detects any of the S0 cluster state and the S1 cluster state, storage of a "1" is completed upon the N+1 level voltage detector 314 detecting any of the S2 cluster state and the S3 cluster state. It will BE understood that the N+1 level voltage detector 314 for a multi-level, 1-bit ECC STT-MTJ cluster cell according to the exemplary embodiments may be a conventional binary comparator as used for conventional STT-MTJ memory reads.

Referring still to FIG. 3, example operations described above reference to the N-element STT-MTJ serial cluster 302 which, as depicted, employs a serial cluster topology. However, a serial topology is only one example for multi-level STT-MTJ clusters according to the exemplary embodiments. The depicted N-element STT-MTJ parallel cluster 350, enabled an enabling switch 354 to the SL line 308 is one example of an alternative STT-MTJ cluster topology. The N-element STT-MTJ parallel cluster 350 includes N STT-MTJ elements, individually labeled as 352-1, 352-2 . . . 352-N that, by iterative programming according to the exemplary embodiments, may establish any of N+1 levels, i.e., N+1 cluster resistance values between points 350A and 350B In one aspect the N-element STT-MTJ parallel cluster 350 may substitute for the N-element STT-MTJ serial cluster 302 in the FIG. 3 multi-level STT-MTJ cluster cell 300. In another aspect, the N-element STT-MTJ parallel cluster 350 may be used in combination with the N-element STT-MTJ serial cluster 302. Upon reading this entire disclosure persons of ordinary skill in the art will understand from comparing a probabilistic programming of an N-element STT-MTJ parallel cluster 350 and a probabilistic programming of an N-element STT-MTJ serial cluster 302 that differences may be exhibited as to $R_{CLST}$ with respect to time, or $R_{CLST}$ with respect to pulse count. For example, there may be differences as to $R_{CLST}$ with respect to time, or $R_{CLST}$ with respect to pulse count exhibited when probabilistic programming the N-element STT-MTJ parallel cluster 350 from one of an all-P and all-AP state to the other of the all-P and all AP states when compared that exhibited during a similar probabilistic programming of the N-element STT-MTJ serial cluster 302. These characteristics will be described in greater detail at later sections.

Figure 4:
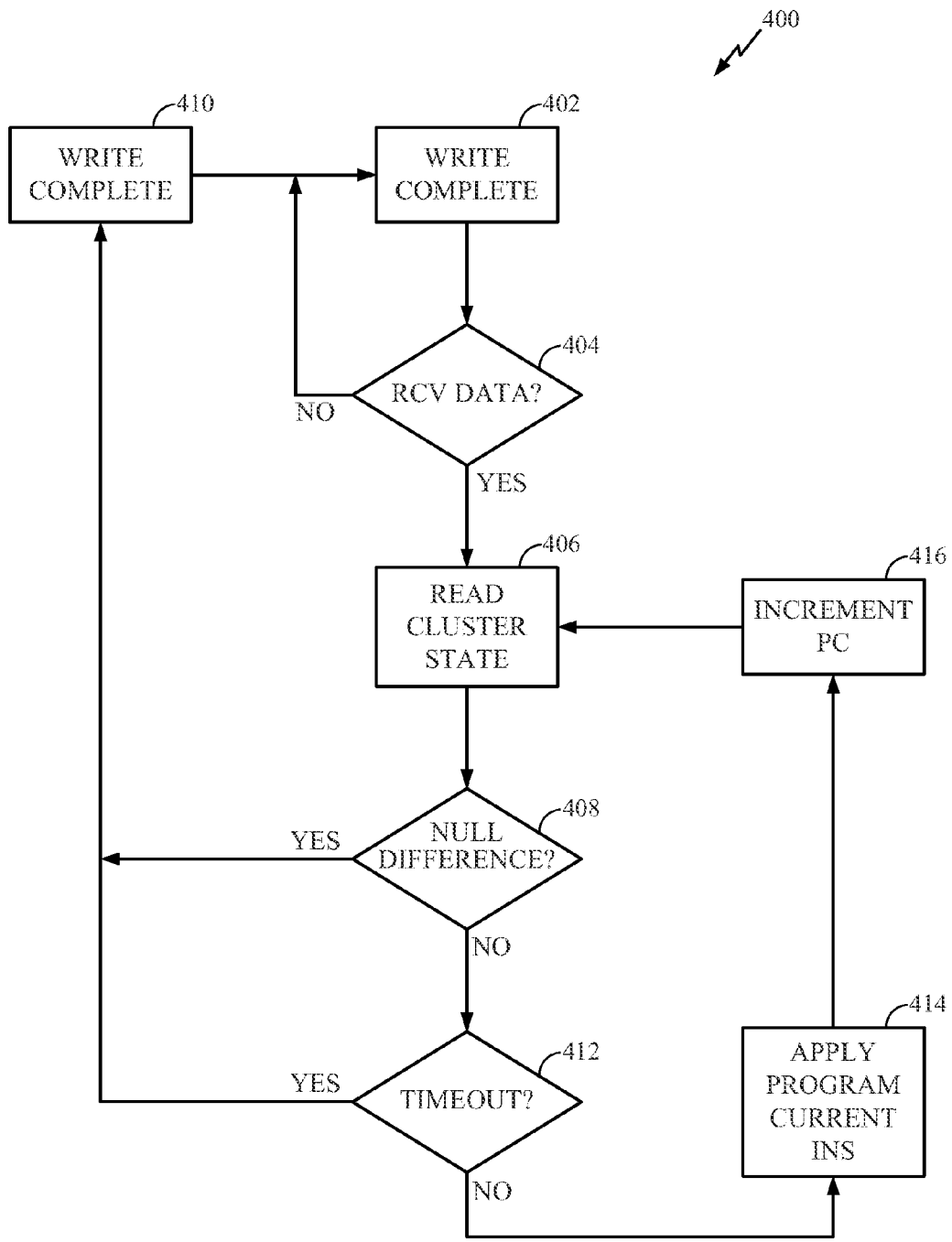
FIG. 4 is a flow diagram of one example probabilistic programming of STT-MTJ cluster memory according to one or more exemplary embodiments.

FIG. 4 is a flow diagram of one example probabilistic programming 400 for a STT-MTJ cluster memory, according to various exemplary embodiments of the invention. To illustrate concepts, a process according to the FIG. 4 example 400 will be described in reference to the FIG. 3 example N-element STT-MTJ cluster cell 300. As will be understood, this is only for purposes of example, and is not any limitation on the scope of STT-MTJ cluster topologies in which probabilistic programming according to the various exemplary embodiments may be practiced.

As will be understood by persons of ordinary skill in the art from this disclosure, the FIG. 4 example probabilistic programming 400 is iterative, and the exact number of loops or iterations required to complete the programming may be unknown. Hence, programming STT-MTJ clusters according to various embodiments may be alternatively referred to as, for example, "iterative programming," "probabilistic programming" or, since the switching of each STT-MTJ element of the STT-MTJ cluster is probabilistic, "probabilistic switching." For brevity, this description uses the term "probabilistic programming," but it will be understood that this term itself places no limit on the scope of any of the various embodiments, or on any aspect of the embodiments. Further, as will be understood by persons of ordinary skill in the art from this disclosure, although "probabilistic" with respect to the exact number of loops or iterations required for completion of the programming, probabilistic programming according to the exemplary embodiment urges the STT-MTJ cluster state toward convergence at any desired programming end-point. It will be appreciated that the statistics of the convergence may be characterized, for example, through circuit analysis (e.g. simulation models) of the particular structure for the STT-MTJ cluster, using particular write current parameters. The characterization may be obtained for a range of programming conditions, e.g., a range of write current parameters. Through such characterization of the STT-MTJ cluster convergence, a time-out for exiting the probabilistic programming may be obtained, the time-out being an iteration count that, when reached, means the statistical probability of the bit being programmed correctly meets a given error rate. The time-out determined from the characterization of the statistics of the convergence of the STT-MTJ cluster may then be employed to limit the maximum bit error rate to a known value specific to the programming condition. In addition, the time-out may be employed to limit the maximum programming delay to a known value specific to the programming condition. In one aspect, described in greater detail at later sections, optimization of the statistics of cluster state convergence of an N-element STT-MTJ cluster, which may minimize the time-out required to ensure meeting a given error rate, may be obtained through, for example, selection of write current parameters.

Referring now to FIG. 4, the example probabilistic programming 400 may start from an initial state 402. The initial state 402 may, for example, be an arbitrary cluster state of any N-element STT-MTJ cluster according to the exemplary embodiments, having whatever $R_{CST}$ is associated with that cluster state. In one aspect the initial state includes, or assumes resetting a PC time-out counter 320 to zero (or a maximum count if the PC time-out counter 320 is configured as a decrementing counter). As an illustration, in performing an example probabilistic programming 400 on the above-described example 4-level 3-bit serial STT-MTJ memory an initial state may be the S1 state, in which one of the three STT-MTJ elements is in the AP state, and the remaining two are in the P state. Using the previously described example relation of $R_P$ and $R_{AP}$, the $R_{CST}$ of cluster state S1 is $4R_P$. Upon receipt at 404 of a value to write, the process goes to 406 where a read of the STT-MTJ cluster 350 is performed. The read at 406 may be provided by, for example, the PGC current source 310 injecting a read current through the STT-MTJ cluster 300 and comparing a voltage at, for example, one of the points 302A and 302B to a reference voltage (not shown). Referring to the FIG. 3 example N-element STT-MTJ cluster 300, the read at 406 may be performed by the N+1 level voltage detector 314 injecting the appropriate read current and then comparing the resulting voltage to the programming target voltage generated by the M-bit data to N+1 level converter 318.

With respect to the above-described read at 406, it will understood that comparing the read voltage at, for example, one of the points 302A and 302B to a reference voltage is only one example for detecting the cluster state of the N-element STT-MTJ cluster. In one alternative according to the exemplary embodiments, an analog-to-digital converter (not shown) may be provided to convert the voltage at the cluster to a digital value, and then to compare the digital value to the target M-bit data. Further, in one aspect the reading/sensing of the cluster state may be performed concurrent with applying the programming current at 414, which is described in greater detail below, instead of requiring a separate step such as 406. Probabilistic programming according to the exemplary embodiments, using this aspect of concurrent read/write, may reduce programming overhead in terms of delay and power. Persons of ordinary skill in the art, from the concepts set forth by this disclosure, will be able to readily identify and implement the necessary modifications of the described examples to practice according to the exemplary embodiments, using the aspect of concurrent read/write.

With continuing reference to FIG. 4, after the read at 406 the example probabilistic programming 400 goes to the null exit decision block 408 which compares the read at 406 to a null difference criterion or other given criterion, examples of which are described below. If the null exit decision block 408 indicates a "YES" the process terminates by going to the write complete block 410 and then back to the initial state 402. In one aspect, the null difference criterion applied by the null exit decision block 408 may be the cluster state being at the target cluster state. In another aspect, the null difference criterion may be defined as the cluster state being within a given distance of the target cluster state. For example, characterizing the target cluster state as a given resistance value the given criterion is for the null exit decision block 408 may be a range of resistance relative to the given resistance value. In addition, depending on design choice and the particular application, the write complete block 410 may include a controller such as the FIG. 3 example probabilistic programming controller 312 generating a "write completion" or "program completion," signal (not shown) that may be utilized by, for example, another processing resource (not shown) associated with the just completed write operation.

As will be understood, one case of a "YES" at the first instance of entering the null exit decision block 408 may be the N-element STT-MTJ cluster already being at the state representing the data to be written.

With continuing reference to FIG. 4, if the null exit decision block 408 indicates "NO" the example probabilistic programming 400 may go to the timeout exit decision block 412, where a time-out counter value "$PC_{LOOP}$" is compared to a given time-out "$PC_{TMOUT}$." The instant example according to the FIG. 4 probabilistic programming 400 started from the initial state block 402, and therefore will not likely timeout at block 412. In subsequent loops or iterations, if the timeout exit decision block 412 indicates a "YES," meaning $PC_{LOOP}$ meets a given relational criteria (e.g., greater than, greater than or equal to) with respect to $PC_{TMOUT}$, the process terminates by going to the write complete block 410 and back to the initial state 402. Depending on design choice and the particular application, the write complete block 410 may include, in response to entry from the timeout exit decision block 412 instead of the null exit decision block 408, a controller such as the FIG. 3 example probabilistic programming controller 312 generating a write time-out signal (not shown) instead of the previously described write completion or program completion signal. It is contemplated that the write time-out signal, or equivalent, may be utilized, for example to repeat the write operation that timed out. It is further contemplated that the write time-out signal, or equivalent, may be utilized, for example to set a flag bit (not shown) indicating the programming operation has not reached the target state, thereby allowing additional error handling procedures.

Referring still to FIG. 4, if the timeout exit decision block 412 indicates a "NO," the process goes to 414, to apply or inject a first or, if the instant loop is a repeat loop, another appropriate programming current pulse, and then goes to 416 and increments $PC_{LOOP}$. Block 414 may be performed by, for example, the PPG controller 312 controlling one or both of the PGC source 310 and the enabling switch 306. In one aspect, block 414 applies $I_{P \to AP}$ and $I_{AP \to P}$ with parameters (e.g., current pulse amplitude and current pulse duration) optimized a priori to require the lowest average PC for the cluster state to converge at the target cluster state, over the full range of state transitions. In another aspect, block 414 may include one or both of the PGC source 310 and the PPG controller 312 being configured via, for example a look-up table (not shown), to adjust one or more parameters of $I_{P \to AP}$ or $I_{AP \to P}$ (and hence the $P_{MTJ}$ for the instant iteration) according to the comparison performed at block 408. After applying $I_{P \to AP}$ and $I_{AP \to P}$ at block 414 and increasing PC at 416, the probabilistic programming 400 goes to block 406 to obtain an updated read of the cluster state, and repeats the depicted and above-described loop until a termination condition is detected at one of the decision blocks 408 and 412.

Example processes and techniques for selecting an optimal $P_{MTJ}$ will now be described. As will be understood by persons of ordinary skill in the art from this disclosure, once an optimal $P_{MTJ}$ is selected the parameters of the programming current may be determined, for example using simulation of the STT-MTJ elements' characteristic of $P_{MTJ}$ with respect to these parameters.

First, terms used for the description of example processes and techniques for optimizing $P_{MTJ}$ will now be defined. It will be understood that these terms themselves are symbols having only the meaning defined herein, and have no inherent meaning and, unless other stated, are not intended to reference or incorporate any identical or similar terms appearing outside of this description.

The variable N is the quantity of STT-MTJ elements in the STT-MTJ cluster being programmed. Referring to the serial N-element STT-MTJ cluster 302 of the FIG. 3 example multilevel STT-MTJ cluster cell 300, N is the value N.

The variable λ is the quantity of STT-MTJ elements to be switched for a cluster state transition. For example, in the above-described example 4-level 3-bit serial STT-MTJ memory arranged according to the FIG. 3 example N-element STT-MTJ serial cluster 302, switching from the S0 cluster state, which is all three of the STT-MTJ elements being in the P state, to the S2 cluster state in which of two of the three STT-MTJ elements being in the AP state, requires two STT-MTJ elements be switched from the P state to the AP state. The value of λ in that example would therefore be two. It will be understood that "λ=N" represents the cluster state transitions that require all STT-MTJs in the cluster to be switched.

As will be readily understood by persons of ordinary skill in the art from this disclosure, if $P_{MTJ}$ is small the worst case state transitions, in terms of an average PC required to converge to the target cluster state, are λ=N, i.e., those that require all of the STT-MTJ elements in the STT-MTJ cluster to be switched. As will likewise be understood by such persons, if $P_{MTJ}$ is large the worst case state transitions are λ=1, i.e., those that require just one of the STT-MTJ elements in the STT-MTJ cluster to be switched.

Additional terms will now be defined.

$p_\tau$ is the switching probability of an STT-MTJ upon the application of a programming pulse with a chosen amplitude and pulse width of τ.

$\bar{n}_{N,\lambda}$ is the average number of programming iterations (i.e., PC) for those state transitions which require λ STT-MTJs to be switched.

$\bar{t}_{N,\lambda}$ denotes the average programming time (delay) for those state transitions which require λ STT-MTJs to be switched.

For N=1, which is the case of just a single STT-MTJ, the average programming iteration and delay for the aforementioned probabilistic programming may be represented as follows:

$$\bar{n}_{N=1,\lambda=N} = p_\tau^{-1} \quad (1)$$

$$\bar{t}_{N=1,\lambda=N} = \tau \cdot p_\tau^{-1} \quad (2)$$

$$\bar{t}_{N=1,\lambda=N,min} = \lim_{p_\tau \to 0} \bar{t}_{N=1,\lambda=N} \quad (3)$$

where $\bar{t}_{N=1,\lambda=N,min}$ represents the minimum average programming delay that can be reached with probabilistic programming, which is much smaller than what can be accomplished by conventional deterministic programming Irrespective of detailed physics behind $p_\tau$, an STT-MTJ switching characterization graph for a particular fabrication process, which is readily generated by a person of ordinary skill in the art after reading this disclosure, shows that this minimum average programming delay is where $P_{MTJ}$ is ~63.2%, due to the relation:

$$P_{MTJ}(\bar{t}_{N=1,\lambda=N,min})=1-e^{-1} \approx 0.63212 \quad (4)$$

For the case of M-bit multi-level cell (MLC) programming with $N=2^M-1$, we have for following relation for the average programming iteration count and average programming delay (time):

$$\bar{n}_{N=2^M-1,\lambda=2^M-1} = \frac{\gamma_M}{P_{MTJ}} \quad (5)$$

$$\bar{t}_{N=2^M-1,\lambda=2^M-1} = \gamma_M \bar{t}_{N=1,\lambda=1}, \quad (6)$$

where $\gamma_M \approx M^{0.866}$.

Contemplated applications of the exemplary embodiments include those in which the programming cost, for example the number of clock cycles required to perform storage operations, is minimal. Probabilistic programming according to the exemplary embodiments may be configured to meet this objective by selecting as the optimal $P_{MTJ}$ the value obtaining the minimum average PC, over a full range of λ.

In one aspect, a $P_{MTJ}$ value optimized according to the objective of minimum average PC may be obtained through, for example, Monte Carlo simulation. Appropriate Monte Carlo simulation may be performed using commercially available simulation systems such as HSPICE or equivalent. Persons of ordinary skill in the art, in view of this disclosure, can readily implement the necessary circuit and device models in a simulation system such as HSPICE and, without undue experimentation, identify a $P_{MTJ}$ value optimized to obtain an optimized average PC.

One empirical formula for the $P_{MTJ}$ that, alone or in conjunction with the above-described Monte Carlo simulation, may give or at least point toward the minimum average PC needed to converge at the desired cluster state is:

$$P_{MTJ,optimal} = \frac{1}{\sqrt{N}}, \qquad (7)$$

One empirical formula that depicts the corresponding minimum average PC, over a wide empirically observed range of cluster topologies, and over all modeled state transitions, i.e., over a full range of λ, may be represented as:

$$PC_{optimal} = \left(\frac{\ln(N)}{8} + 1\right)\sqrt{N}. \qquad (8)$$

Figure 5:
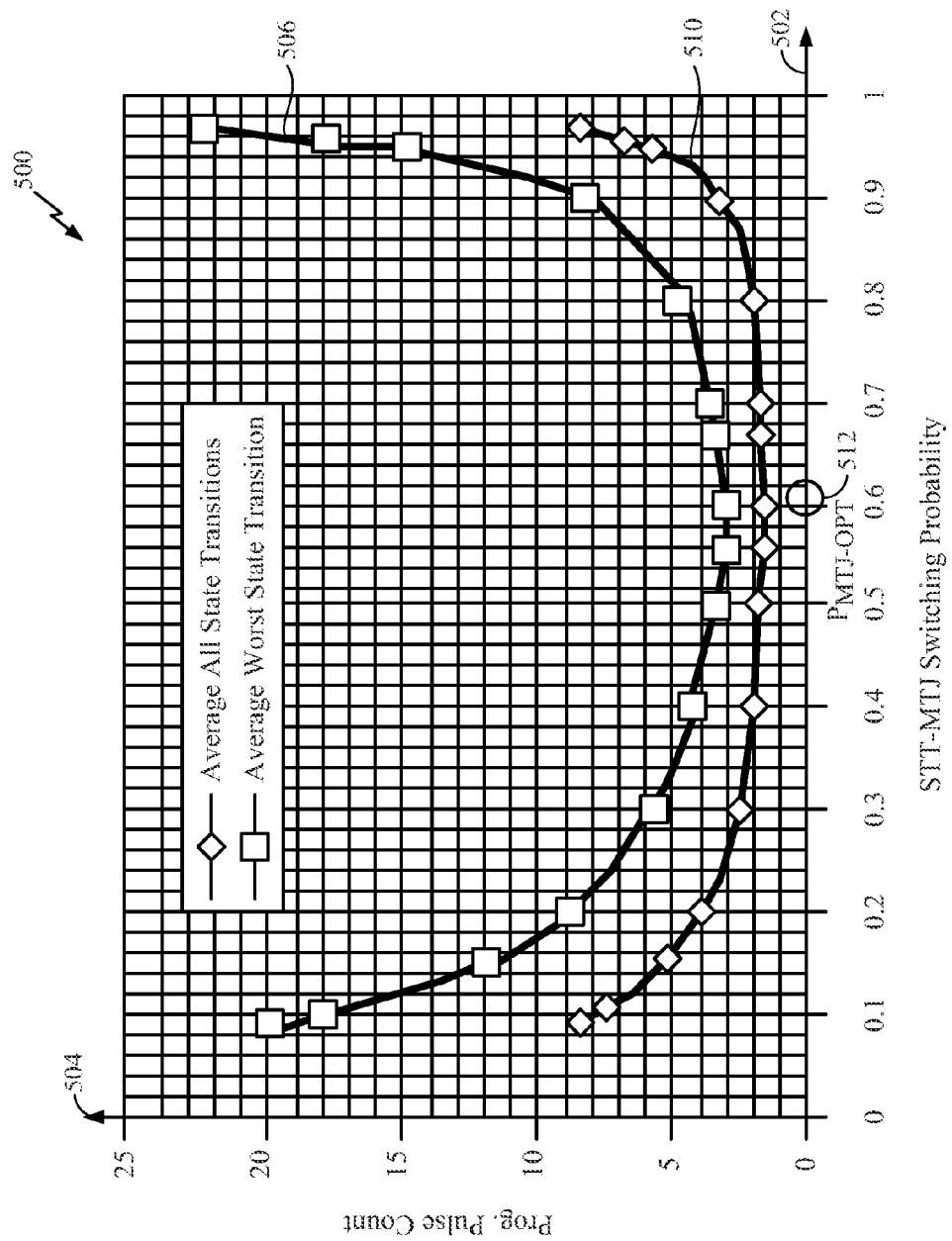
FIG. 5 is a simulation result showing one example process for selecting and/or confirming optimal STT-MTJ switching probability for probabilistic programming of STT-MTJ cluster memory according to one or more exemplary embodiments.

FIG. 5 is simulation result 500 having a horizontal axis 502 representing a range of values of $P_{MTJ}$ used in a modeled 3-element, 4-level STT-MTJ cluster having a serial cluster topology such as the N-element STT-MTJ serial cluster 302 of the FIG. 3 STT-MTJ cluster memory cell 300. Vertical axis 504 is the simulation result of the average PC required to converge to the target state. Plot line 506 shows the $P_{MTJ}$ versus average PC for simulated worst case λ cluster state transitions for a particular $P_{MTJ}$ is used, in other words cluster state transitions requiring all three of the STT-MTJ elements to switch P/AP state when $P_{MTJ}$ is close to zero and cluster state transitions with λ=1 when $P_{MTJ}$ is close to 100%. Plot line 510 shows the $P_{MTJ}$ versus average PC for a simulation of all state transitions λ, in other words all cluster state transitions requiring one, two, or three STT-MTJ elements to switch P/AP state. The superposed marker 512, labeled "PMTJ-OPT," is the value of $_{PMTJ,OPT}$ obtained from the empirical formula (1) above. As seen, simulation results and the empirical formula (1) show conformance.

Figures 6, 7:
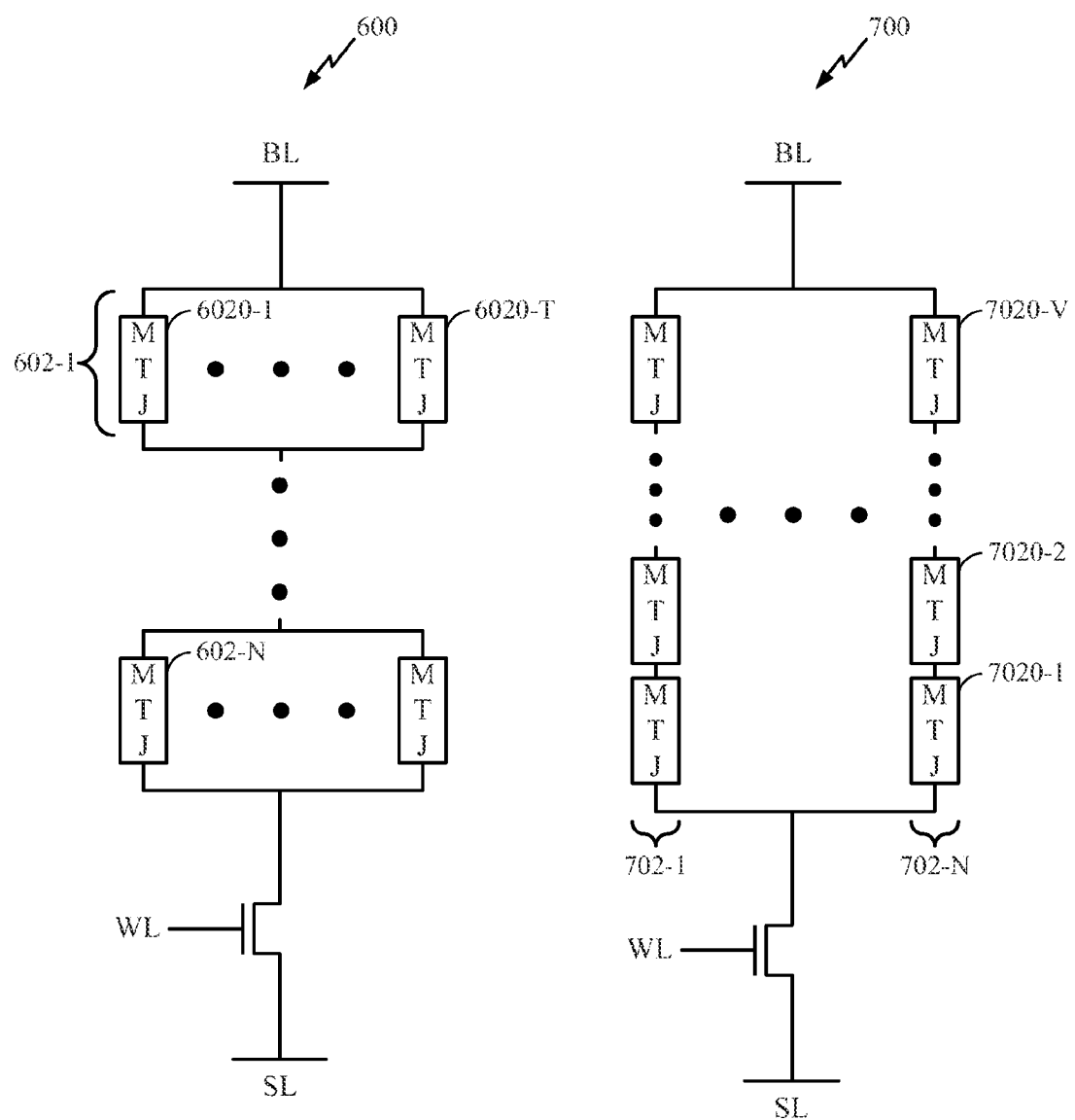
FIG. 6 shows one example of one hybrid serial/parallel STT-MTJ cluster for a probabilistic program STT-MTJ cluster memory according to one or more exemplary embodiments.
FIG. 7 shows one example of one hybrid parallel/serial STT-MTJ cluster for a probabilistic program STT-MTJ cluster memory according to one or more exemplary embodiments.

FIG. 6 shows one example hybrid serial/parallel STT-MTJ cluster 600 for a probabilistic program STT-MTJ cluster memory according to one or more exemplary embodiments. The FIG. 6 example hybrid serial/parallel STT-MTJ cluster 600 includes a serial coupling of N parallel topology STT-MTJ clusters, 602-1 . . . 602-N, each parallel topology STT-MTJ cluster 602 having T STT-MTJ elements 6020-1 . . . 6020-T in parallel.

FIG. 7 shows one example hybrid parallel/serial STT-MTJ cluster 700 of a probabilistic program STT-MTJ cluster memory according to one or more exemplary embodiments. The FIG. 7 example hybrid parallel/serial STT-MTJ cluster 700 includes a parallel coupling of N serial topology STT-MTJ clusters, 702-1 . . . 702-N (: generically referenced as "702-x"), each serial topology STT-MTJ cluster 702-x having V STT-MTJ elements 7020-1, 7020-2 . . . 7020-V in series.

Figure 8:
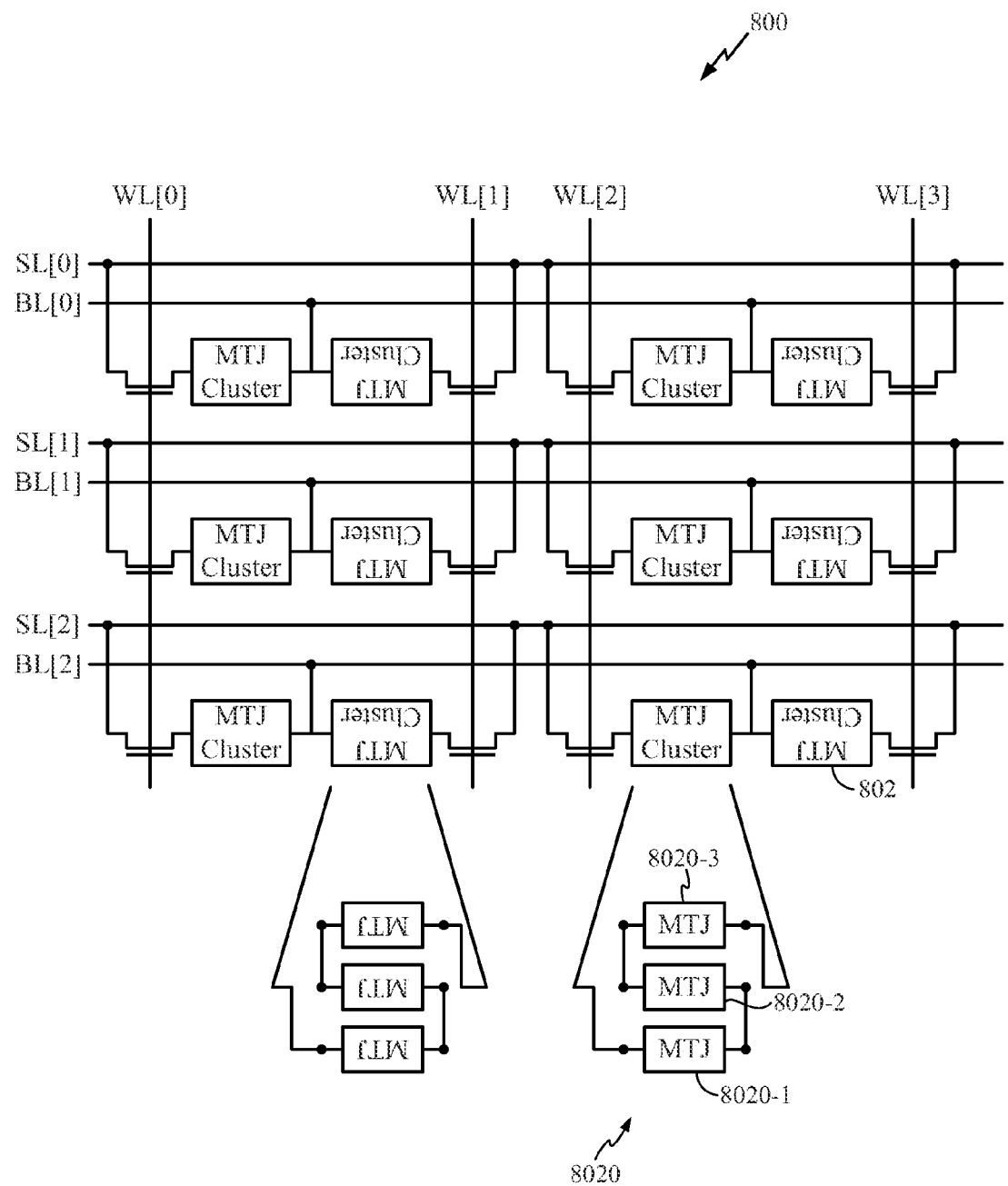
FIG. 8 shows one example MRAM array of cells having one serial STT-MTJ cluster aspect of probabilistic program STT-MTJ cluster memory according to one or more exemplary embodiments.

FIG. 8 shows one example MRAM array 800 formed of 3-element, 4-level STT-MTJ serial clusters 802, each having a topology shown in expanded view as 8020 of three series coupled STT-MTJ elements 8020-1, 8020-2 and 8020-3, such as the N-element STT-MTJ serial cluster 302 of the FIG. 3 example multi-level STT-MTJ cluster memory 300.

Figure 9:
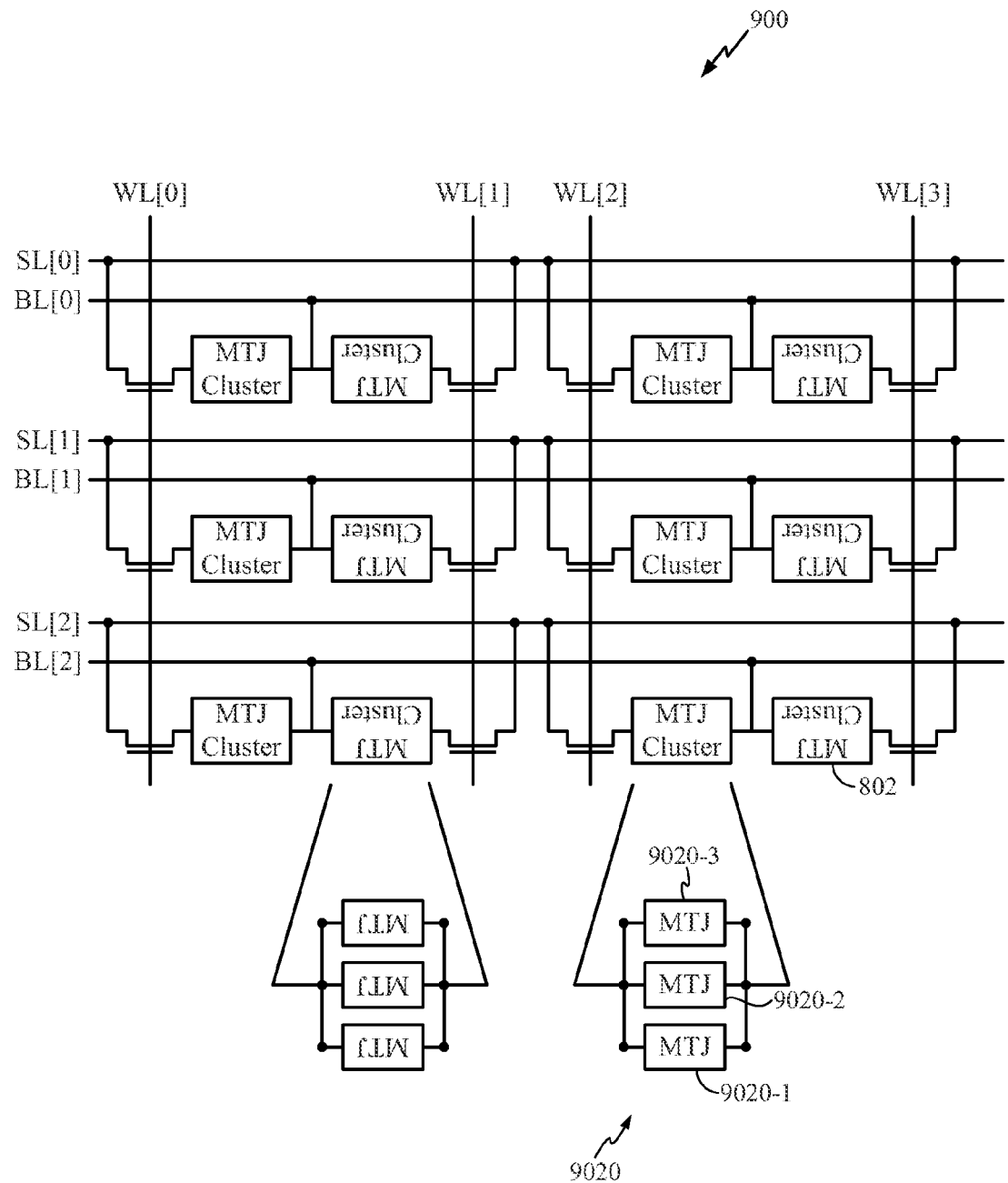
FIG. 9 shows one example MRAM array of cells having one parallel STT-MTJ cluster aspect of probabilistic program STT-MTJ cluster memory according to one or more exemplary embodiments.

FIG. 9 shows one example MRAM array 900 formed of 3-element, 4-level STT-MTJ parallel clusters 902, each having a topology shown in expanded view as 9020 of three parallel coupled STT-MTJ elements 9020-1, 9020-2 and 9020-3, such as the N-element STT-MTJ parallel cluster 350 of the FIG. 3 example multi-level STT-MTJ cluster memory 300.

Figure 10:
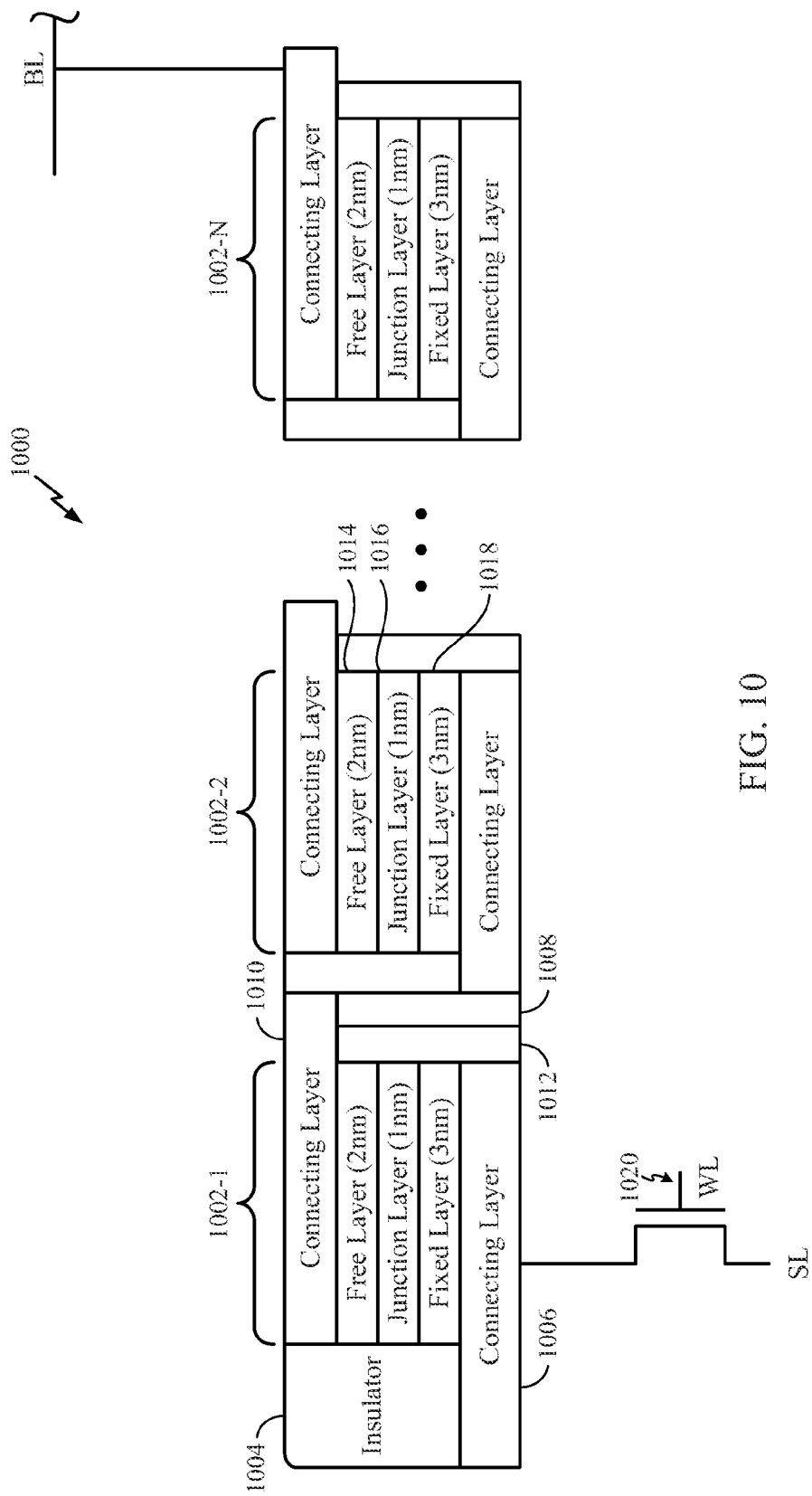
FIG. 10 shows in cross-sectional view one example of a wired interconnect serial STT-MTJ cluster for a probabilistic program STT-MTJ cluster memory according to one or more exemplary embodiments.

FIG. 10 shows in cross-sectional view one example of a wired interconnect serial STT-MTJ cluster 1000 for a probabilistic program STT-MTJ cluster memory according to one or more exemplary embodiments. It will be understood that the FIG. 10 cross-sectional view, to avoid obscuring novel concepts that it depicts, omits structural features of STT-MTJ elements that are not particular to the embodiments and, instead, shows structural features at a detail sufficient for persons of ordinary skill in the art of STT-MTJ design and fabrication to design, fabricate and test an STT-MTJ cluster that embodies any one or more of the depicted concepts. Referring to FIG. 10, the STT-MTJ cluster 1000 forms N STT-MTJ elements 1002-1, 1002-2 . . . 1002-N (generically referenced as "1002-x"). Each STT-MTJ element 1002-x may be an STT-MTJ stack of a fixed layer 1018, a junction layer 1016 and free layer 1014, between a bottom connecting layer 1006 and a top connecting layer 1010. The leftmost STT-MTJ element 1002-1 has its STT-MTJ stack between an end insulator 1004 and an inter-element insulator 1012. The other STT-MTJ elements (1002-2 . . . 1002-N) have corresponding STT-MTJ stacks between insulators 1012. A vertical connecting layer 1008 connects each STT-MTJ element 1002-x in series to a next STT-MTJ element 1002-x. The wired interconnect serial STT-MTJ cluster 1000 is termed "wired" because of the connecting layers 1008 forming the element-to-element connections. In one aspect a wired interconnect serial STT-MTJ cluster such as the example 1000 may be used, for example, as the N-element STT-MTJ serial cluster 302 of the FIG. 3 example multi-level STT-MTJ cluster memory 300. To show an example, the top connecting layer 1010 of the rightmost end STT-MTJ element 1002-N is connected to a bit line BL, while the bottom connecting layer 1006 of the leftmost end STT-MTJ element 1002-1 is connected to a source line SL, through an example enabling switch 1020.

Figure 11:
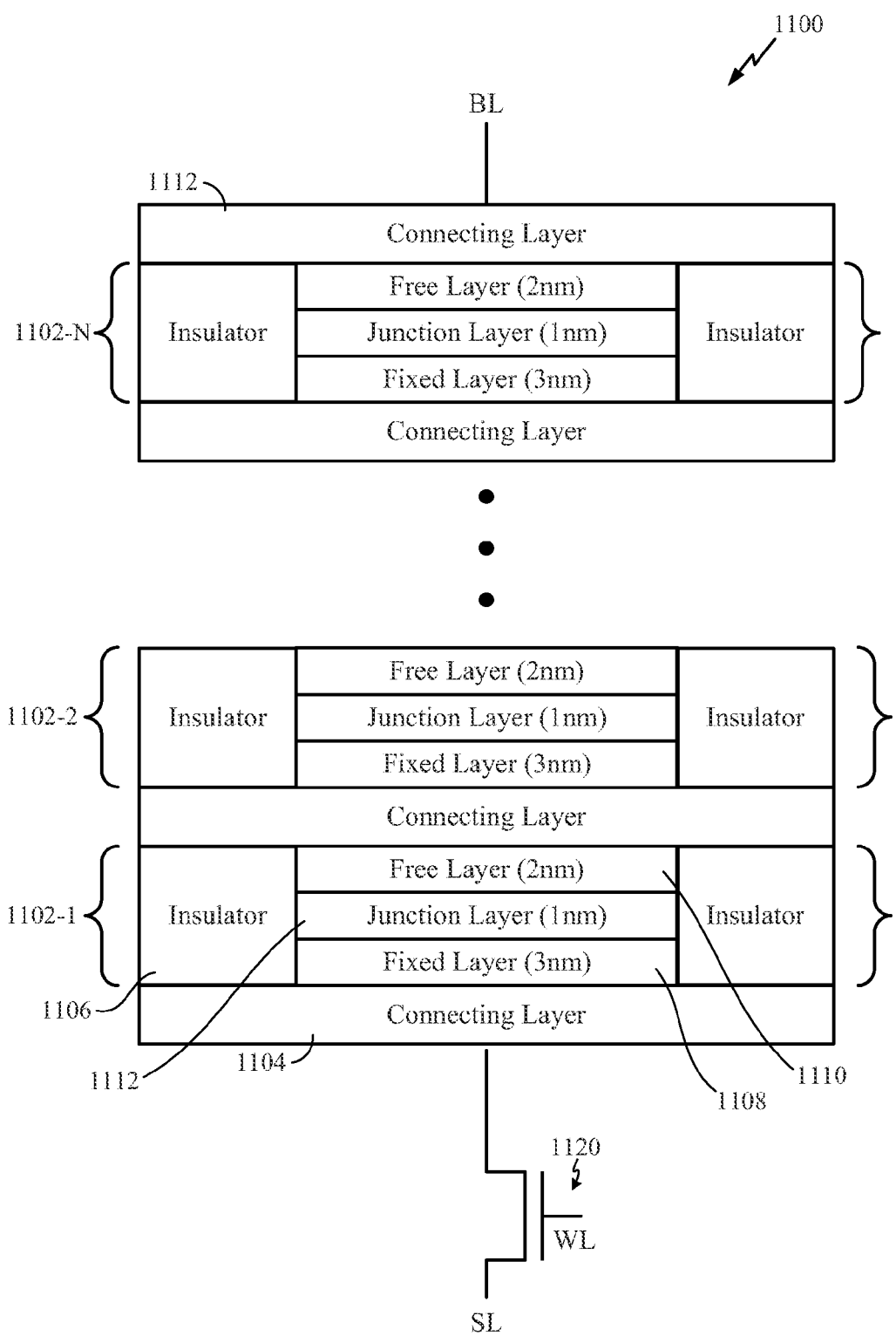
FIG. 11 shows in cross-sectional view one example of a stacked serial STT-MTJ cluster for a probabilistic program STT-MTJ cluster memory according to one or more exemplary embodiments.

FIG. 11 shows in cross-sectional view one example of a stacked wired interconnect serial STT-MTJ cluster 1100 for a probabilistic program STT-MTJ cluster memory according to one or more exemplary embodiments. It will be understood that the FIG. 11 cross-sectional view, to avoid obscuring novel concepts that it depicts, omits structural features of STT-MTJ elements that are not particular to the embodiments and, instead, shows structural features at a detail sufficient for persons of ordinary skill in the art of STT-MTJ design and fabrication to design, fabricate and test an STT-MTJ cluster that embodies any one or more of the depicted concepts. Referring to FIG. 11, the stacked wired interconnect serial STT-MTJ cluster 1100 has a stack of N STT-MTJ elements 1102-1, 1102-2 . . . 1102-N (generically referenced as "1102-x"). Each STT-MTJ element 1102-x is formed of bottom connecting layer 1104 on which is an STT-MTJ stack of a fixed layer 1108, a junction layer 1112 and a free layer 1110, between two insulators 1106. The stacked wired interconnect serial STT-MTJ cluster 1100 is termed "wired" because of the bottom connecting layers 1104 forming the element-to-element connections. In the example, the bottom connecting layers 1104 of the bottom STT-MTJ element 1102-1 is connected through an enabling switch 1120 to a source line. The top STT-MTJ element 1102-N has a top connect layer 1112 shown connected to a bit line BL.

Figure 12:
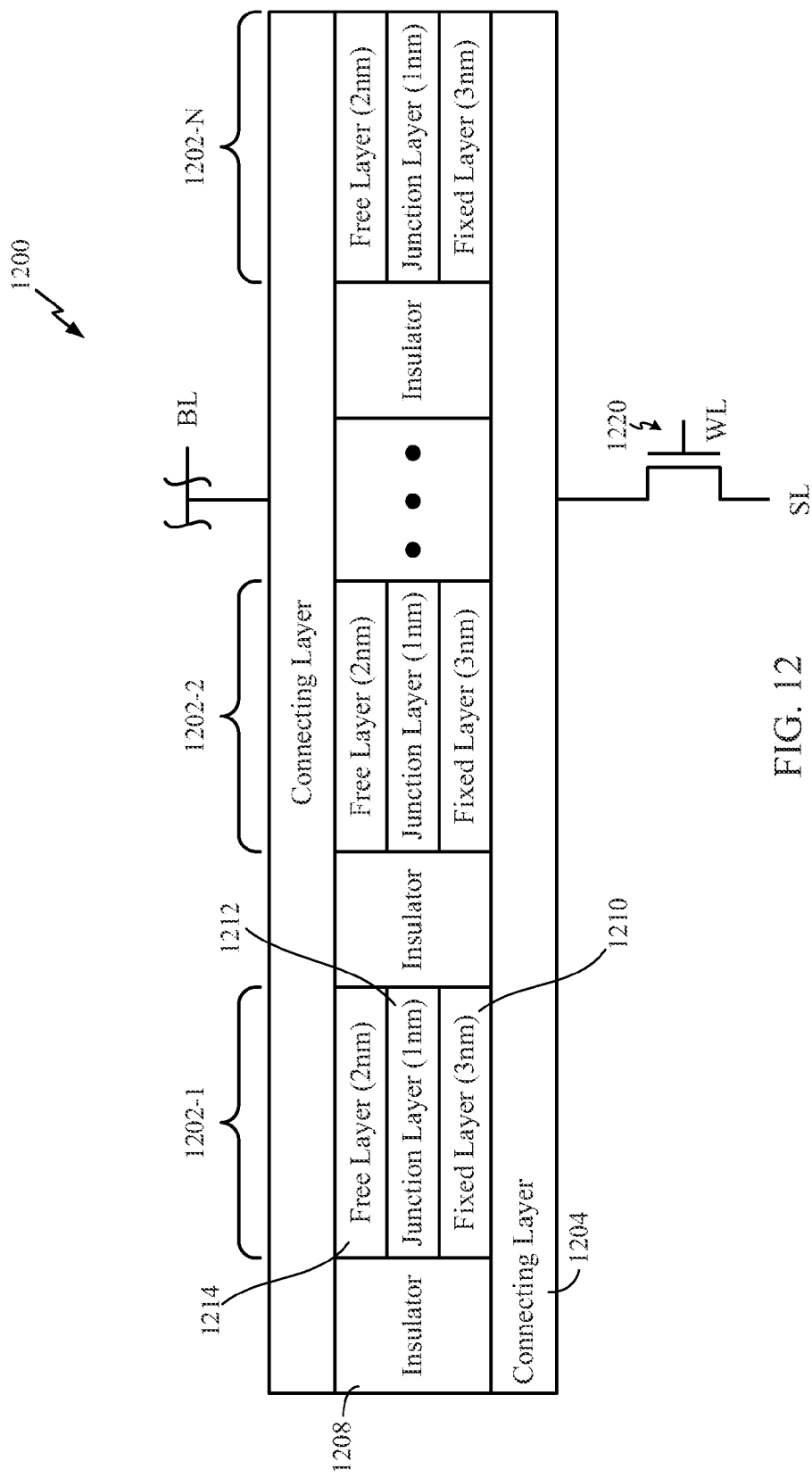
FIG. 12 shows in cross-sectional view one example of an abutted parallel STT-MTJ cluster for a probabilistic program STT-MTJ cluster memory according to one or more exemplary embodiments.

FIG. 12 shows in cross-sectional view one example of an abutted parallel STT-MTJ cluster 1200 for a probabilistic program STT-MTJ cluster memory according to one or more exemplary embodiments. It will be understood that the FIG. 12 cross-sectional view, to avoid obscuring novel concepts that it depicts, omits structural features of STT-MTJ elements that are not particular to the embodiments and, instead, shows structural features at a detail sufficient for persons of ordinary skill in the art of STT-MTJ design and fabrication to design, fabricate and test an STT-MTJ cluster that embodies any one or more of the depicted concepts. Referring to FIG. 12, the abutted parallel STT-MTJ cluster 1200 is formed of N STT-MTJ elements 1202-1, 1202-2 . . . 1202-N (generically referenced as "1202-$x$") formed in a mechanically abutting manner. Each STT-MTJ element 1202-$x$ couples at its lower end, or base, to a connecting layer 1204 that spans across the entire cluster. Each STT-MTJ element 1202-$x$ is formed of a stack of a fixed layer 1210 contacting a bottom connecting layer 1204, a junction layer 1212 above the fixed layer 1210, and a free layer 1214 on the junction layer 1212. An insulator 1208 separates the adjacent STT-MTJ elements 1202-$x$. A top connecting layer 1206 spans over the top the entire cluster, contacting the free layer 1214 of each STT-MTJ element 1202. In the example, the bottom connecting layer 1204 is shown connected through an enabling switch 1220 to a source line, and the top connecting layer 1206 is shown connected to a bit line BL. In one aspect an abutted parallel STT-MTJ cluster such as the example 1200 may be used, for example, as the N-element STT-MTJ parallel cluster 350 that is shown as one alternative STT-MTJ cluster in the FIG. 3 example multi-level STT-MTJ cluster memory 300.

Figure 13:
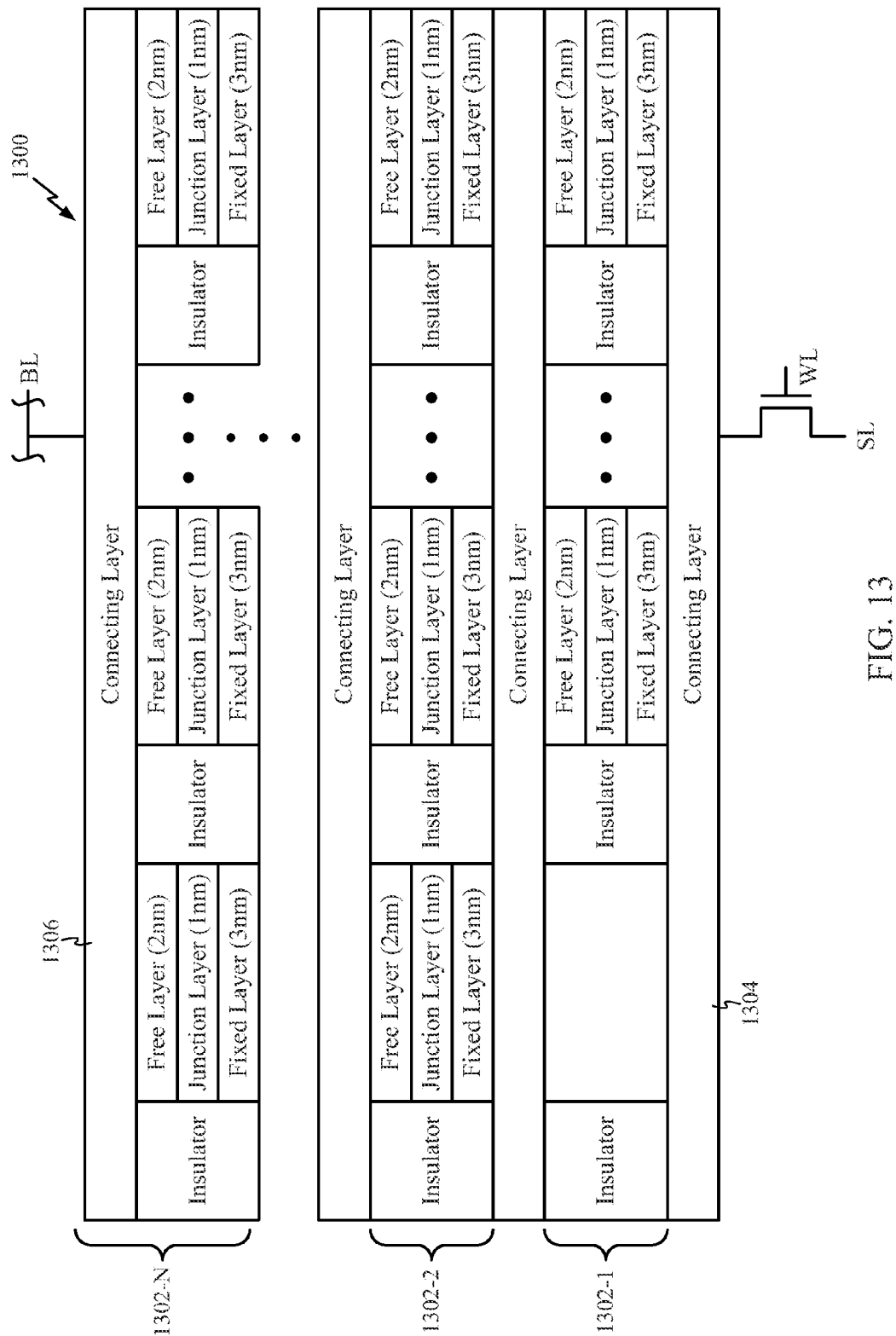
FIG. 13 shows in cross-sectional view one example of a stacked structure of abutted parallel STT-MTJs for an STT-MTJ cluster in a probabilistic program STT-MTJ cluster memory according to one or more exemplary embodiments.

FIG. 13 shows in cross-sectional view one example of a stacked serial/parallel hybrid STT-MTJ cluster 1300 for a probabilistic program STT-MTJ cluster memory according to one or more exemplary embodiments. It will be understood that the FIG. 13 cross-sectional view, to avoid obscuring novel concepts that it depicts, omits structural features of STT-MTJ elements that are not particular to the embodiments and, instead, shows structural features at a detail sufficient for persons of ordinary skill in the art of STT-MTJ design and fabrication to design, fabricate and test an STT-MTJ cluster that embodies any one or more of the depicted concepts. Referring to FIG. 13, the stacked serial/parallel hybrid STT-MTJ cluster 1300 includes a stack of N abutted parallel STT-MTJ clusters 1302-1, 1302-2 . . . 1302-N (generically referenced as "1302-$x$"). In one aspect, each of abutted parallel clusters 1302-$x$ may be according to the FIG. 12 abutted parallel STT-MTJ cluster 1200, except that the bottom connecting layer 1304 for all except the bottom parallel STT-MTJ cluster 1302-1 acts as the top connecting layer (not separately numbered) for its underlying STT-MTJ cluster 1302-$x$, and only top the parallel STT-MTJ cluster 1302-N has a top connecting layer 1306. In one aspect a stacked abutted parallel STT-MTJ cluster such as the example 1300 may be used, for example, as the FIG. 6 example serial/parallel hybrid STT-MTJ cluster 600.

Figure 14:
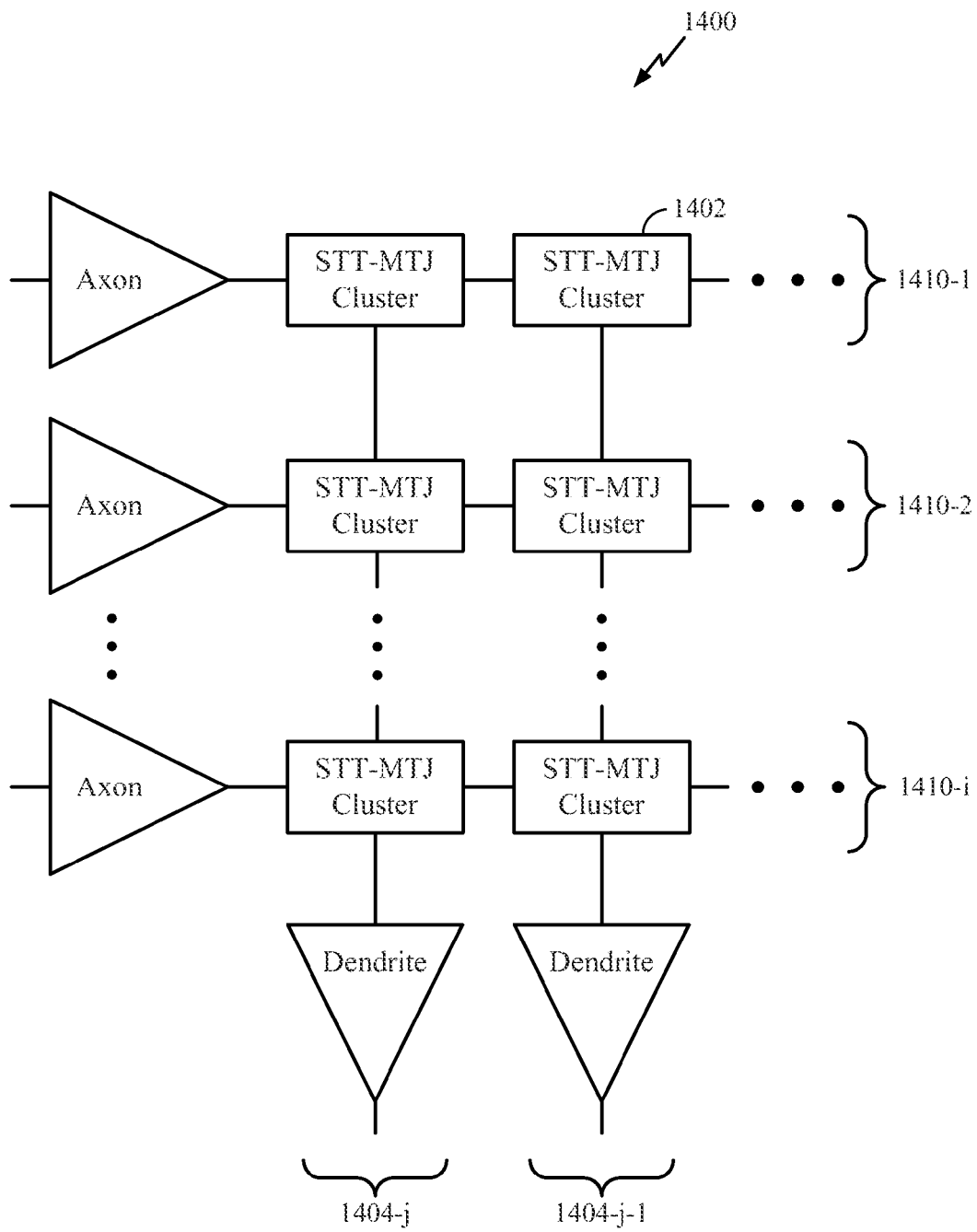
FIG. 14 shows one probabilistic program STT-MTJ neural array according to one or more exemplary embodiments.

FIG. 14 shows a representative portion of an STT-MTJ neural network 1400 according to one exemplary embodiment that employs probabilistic program N-element STT-MTJ clusters as synapses. The STT-MTJ neural network 1400 essentially represents a i×j×k matrix for a system with i axon rows 1410-1, 1410-2 . . . 1410-$i, j$ dendrite columns, of which 1404-$j$ and 1404-$j$-1 are shown, and k-bit MLC synapses made of STT-MTJ clusters 1402. The STT-MTJ clusters 1402 may, for example, be implemented using the FIG. 3 example N-element STT-MTJ cluster cell 300, with N, the number of STT-MTJ elements being $2^k-1$. Using probabilistic programming of the STT-MTJ clusters 1402, such as described in reference to FIG. 4, any i×j×k matrix state can be learned. Due to the very nature of probabilistic switching, which closely mimics how the synapses function in a brain, STT-MTJ clusters according to various exemplary embodiments fit naturally the role of synapses in neural networks. One additional advantage this STT-MTJ neural network 1400 is the capability of achieving maximum programmability with minimum IOs, and accomplishing with high performance in term of low power, fast programming speed enabled by probabilistic STT-MTJ cluster programming.

As known by persons of ordinary skill in the art of neural networks, in real biological neural network, stimuli are passed from axons to dendrites through synapses. The more stimuli pass through a synapse, the more likely the synapse becomes more conductive (better bonding) in general, while becoming less conductive (less bonding) if the stimuli are in fact inhibitors. It will be appreciated by such persons that probabilistic switching of STT-MTJs according to the exemplary embodiments makes STT-MTJ clusters very suitable to be used as synapses in artificial neural network. As one example, a minor modification of the PPG controller 312 of the FIG. 3 example N-element STT-MTJ cluster cell 300 may apply continuous pulses to the STT-MTJ cluster (e.g., the N-element STT-MTJ serial cluster 302). As the pulses proceed, or as the pulse proceeds, more and more STT-MTJs will switch, either from P to AP, or AP to P, depending on the direction of the probabilistic programming current. This switching corresponds, in turn, to higher and higher conductance (if the probabilistic programming current switches STT-MTJs from AP to P), or lower and lower conductance (if the current switches STT-MTJs from P to AP). Therefore, the probabilistic programming current pulses, which emulate the neural stimuli, can be used to increase the bonding of synapses in neural networks, forming biological memory. As an added benefit, programming current pulses with reversed direction can be used to decrease the bonding of synapses, erasing biological memory or mimicking the effect of inhibitions, which may relate significantly to training.

In practicing a neural network with probabilistic programmable STT-MTJ clusters according to the exemplary embodiments, there may be a desire to characterize linearity, as well as increase or decrease linearity of the change in cluster resistance, i.e., $R_{CLST}$, with respect to pulse count, or programming duration. Further to this practice, it may be noted that for a serial topology N-element STT-MTJ cluster being probabilistic programmed to switch from all P to all AP, $R_{CLST}$ at a given cluster state the cluster resistance may be represented as follows:

$$R_{CLST} = xR_{MTJ}^{AP} + (N-x)R_{MTJ}^{P} \quad (9)$$

where $R_{MTJ}^{AP}$ is the resistance of each STT-MTJ element in the AP state and $R_{MTJ}^{P}$ is the resistance of each STT-MTJ element in the P state, N is the quantity of STT-MTJ elements, and x is the quantity of the STT-MTJ elements in the AP state.

The delta change in the $R_{CLST}$, meaning the change in $R_{CLST}$ resulting from each STT-MTJ element switching from P to AP, while the serial topology STT-MTJ cluster is being switched from P to AP may be represented as follows:

$$\frac{dR_{CLST}}{dx} = R_{MTJ}^{AP} - R_{MTJ}^{P} \quad (10)$$

The cluster resistance, and the delta change in cluster resistance, in switching an N-element serial topology STT-MTJ cluster from all AP to all P are similar to the above characteristics.

Probabilistic programming according to the exemplary embodiments, though, does not produce a constant number of STT-MTJ elements switching per unit time. Therefore, some non-linearity may show in an actual probabilistic programming of an N-element STT-MTJ cluster as described above.

It may also be noted that, for a parallel topology m-element STT-MTJ cluster being probabilistically programmed to switch from all P to all AP, the cluster resistance $R_{CLST}$ at a given cluster state with x STT-MTJs in the AP state may be represented as follows:

$$R_{CLST} = \frac{R_{MTJ}^{AP} R_{MTJ}^{P}}{(m-x)R_{MTJ}^{AP} + xR_{MTJ}^{P}} \quad (11)$$

The delta change in the $R_{CLST}$, meaning the change in $R_{CLST}$ resulting from each STT-MTJ element of the parallel topology m-element STT-MTJ cluster switching from P to AP, while the parallel topology STT-MTJ cluster is being switched from all-P to all-AP may be represented as follows:

$$\frac{dR_{CLST}}{dx} = \frac{R_{MTJ}^{AP} R_{MTJ}^{P}}{(R_{MTJ}^{AP} - R_{MTJ}^{P})\left(\frac{mR_{MTJ}^{AP}}{R_{MTJ}^{AP} - R_{MTJ}^{P}} - x\right)^2} \quad (12)$$

As readily seen, this delta is not linear while the parallel topology STT-MTJ cluster is being switched from all-P to all-AP.

For the parallel topology m-element STT-MTJ cluster being probabilistic programmed to switch from all AP to all P, the cluster resistance $R_{CLST}$ at a given cluster state with x STT-MTJs in the P state may be represented as follows:

$$R_{CLST} = \frac{R_{MTJ}^{P} R_{MTJ}^{AP}}{(m-x)R_{MTJ}^{P} + xR_{MTJ}^{AP}} \quad (13)$$

The delta change in the $R_{CLST}$, meaning the change $R_{CLST}$ resulting from each STT-MTJ element of the parallel topology m-element STT-MTJ cluster switching from AP to P, while the parallel topology STT-MTJ cluster is being switched from AP to P may be represented as follows:

$$\frac{dR_{CLST}}{dx} = \frac{R_{MTJ}^{P} R_{MTJ}^{AP}}{(R_{MTJ}^{P} - R_{MTJ}^{AP})\left(\frac{mR_{MTJ}^{P}}{R_{MTJ}^{P} - R_{MTJ}^{AP}} - x\right)^2} \quad (14)$$

Persons of ordinary skill in the art will appreciate from this disclosure that employing serial/parallel hybrid topology multi-element STT-MTJ clusters such as the FIG. 6 example 600, or the parallel/serial hybrid topology multi-element STT-MTJ clusters such as the FIG. 7 example 700, or both in combination, may provide for selecting and modifying linearity characteristics.

Figure 15:
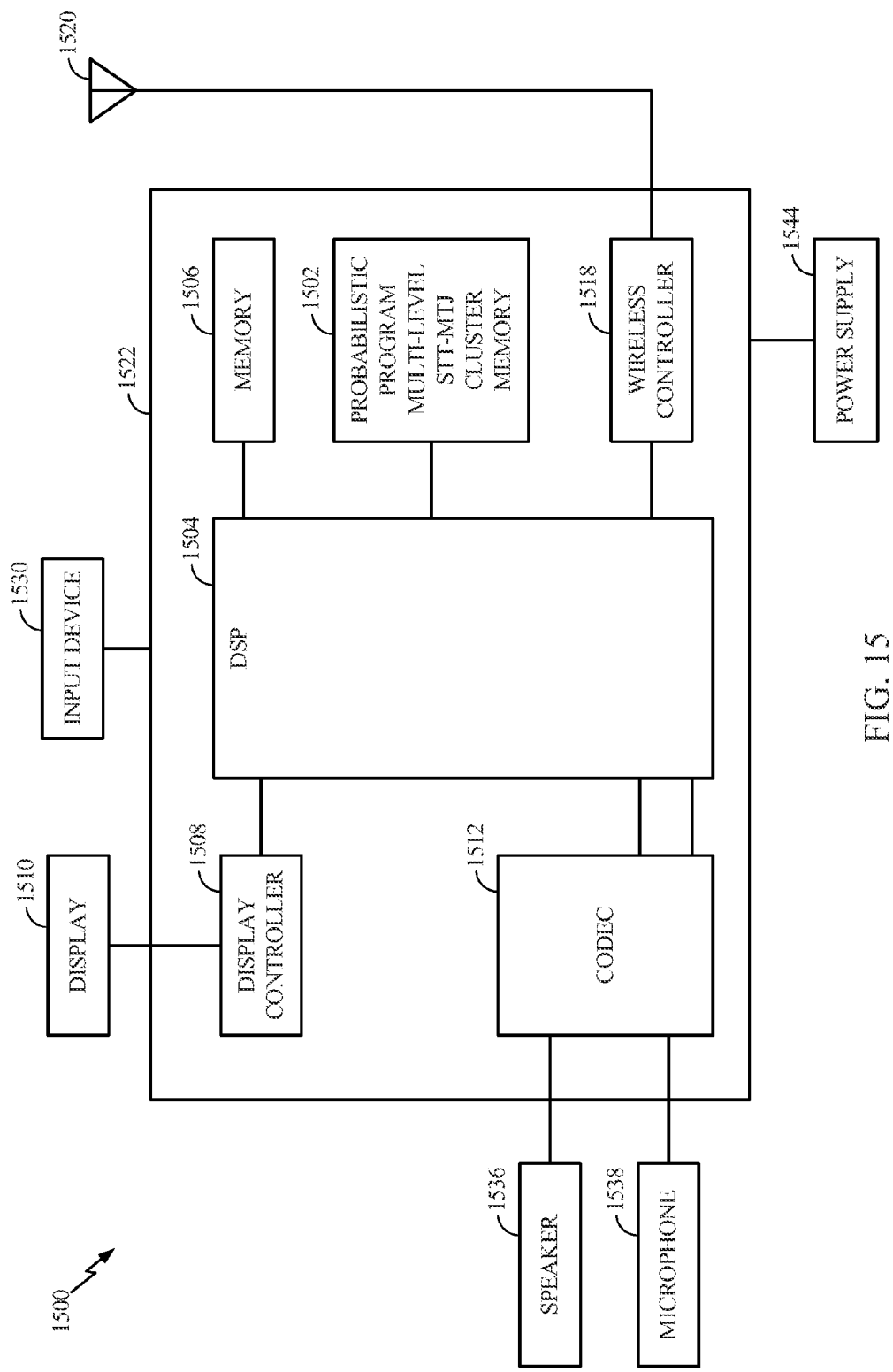
FIG. 15 is a functional block diagram of one example personal computing device according to one or more exemplary embodiments.

FIG. 15 is a functional block diagram of an electronic device 1500, such as a wireless phone according to one or more exemplary embodiments. The device 1500 may include a probabilistic program multi-level, e.g., N-element STT-MTJ cluster memory circuit 1502 coupled to a processor or processing unit such as a digital signal processor (DSP) 1504 that may be coupled to another memory 1506, for example a DRAM. In one illustrative example, the probabilistic program N-element STT-MTJ cluster memory circuit 1502 may include the apparatus such the N-element STT-MTJ cluster memory cell 300 described in reference to FIG. 3, or as one alternative, the MRAM array 800 having 3-element, 4-level STT-MTJ serial clusters 802 as described in reference to FIG. 8, or as another alternative, the MRAM array 900 having 3-element, 4-level STT-MTJ parallel clusters 902 as described in reference to FIG. 9 or, in another alternative, any combination thereof.

Referring still to FIG. 15, the electronic device 1500 may have a display controller 1508 coupled to the DSP 1504 and to a display 1510. In addition, a coder/decoder (CODEC) 1512 may be coupled to the DSP 1504, and to a speaker 1536 and a microphone 1538. A wireless controller 1518 may be coupled to the digital signal processor 1504 and to a wireless antenna 1520. In a particular embodiment, the DSP 1504, memory 1506, the display controller 1508, the probabilistic program multi-level STT-MTJ cluster memory circuit 1502, and the CODEC 1512, and the wireless controller 1518 are included in a system-in-package or system-on-chip (SOC) 1522. In a particular embodiment, an input device 1530 (e.g., touchpad, keypad, other human command interface) and a power supply 1544 are coupled to the SOC 1522. Moreover, as illustrated in FIG. 15, in one aspect the display 1510, the input device 1530, the speaker 1536, the microphone 1538, the wireless antenna 1520, and the power supply 1544 may be external to the SOC 1522. However, each may be coupled to one or more components of the SOC 1522, for example through an interface or a controller.

Figure 16:
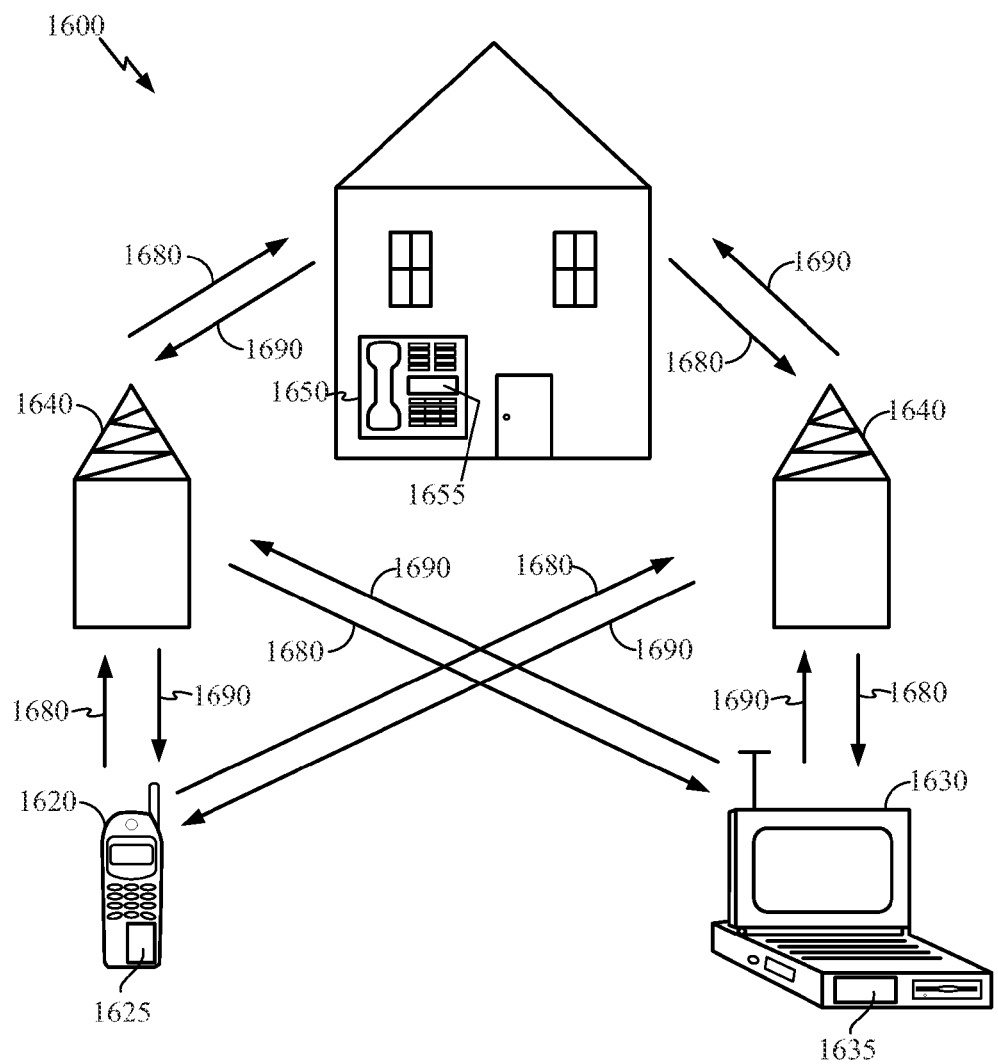
FIG. 16 is a functional block diagram of example personal computing devices according to one or more exemplary embodiments.

FIG. 16 illustrates an exemplary wireless communication system 1600 in which one or more embodiments of the disclosure may be advantageously employed. For purposes of illustration, FIG. 16 shows three remote units 1620, 1630, and 1650 and two base stations 1640. It will be recognized that conventional wireless communication systems may have many more remote units and base stations. The remote units 1620, 1630, and 1650 include integrated circuit or other semiconductor devices 1625, 1635 and 1655 (including on-chip voltage regulators, as disclosed herein), which are among embodiments of the disclosure as discussed further below. FIG. 16 shows forward link signals 1680 from the base stations 1640 and the remote units 1620, 1630, and 1650 and reverse link signals 1690 from the remote units 1620, 1630, and 1650 to the base stations 1640.

In FIG. 16, the remote unit 1620 is shown as a mobile telephone, the remote unit 1630 is shown as a portable computer, and the remote unit 1650 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 16 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A probabilistic resistive memory, comprising:
a cluster of bi-stable switching elements;
means for detecting a state of a resistance through the cluster of bi-stable switching elements;
means for determining at least one programming current attribute based on the detected state;
means for applying the programming current to the cluster of bi-stable switching elements according to the at least one determined programming current attribute; and
means for iterating the detecting, the determining and the applying until a given programming completion state is reached.

2. The probabilistic resistive memory of claim 1, wherein the means for iterating includes means for counting a number of iterations of iterating the detecting, the determining and the applying, and wherein one programming completion state is a given timeout equal to a given number of iterations.

3. The probabilistic resistive memory of claim 1, wherein one programming completion state is said detecting a state of the resistance meeting a given resistance criterion.

4. The probabilistic resistive memory of claim 1, wherein the means for iterating includes means for counting the number of iterations, wherein one programming completion state is the number of iterations reaching a given timeout, and another programming completion state is said means for detecting a state of the resistance detecting a resistance meeting a given resistance criterion.

5. The probabilistic resistive memory of claim 1, wherein the probabilistic resistive memory is integrated in at least one semiconductor die.

6. The probabilistic resistive memory of claim 5, further comprising a device, selected from the group consisting of a set top box, music player, video player, entertainment unit, navigation device, communication device, personal digital assistant (PDA), fixed location data unit, and a computer, into which the probabilistic resistive memory is integrated.

* * * * *